(12) United States Patent
Hshieh et al.

(10) Patent No.: US 7,397,102 B2
(45) Date of Patent: Jul. 8, 2008

(54) JUNCTION BARRIER SCHOTTKY WITH LOW FORWARD DROP AND IMPROVED REVERSE BLOCK VOLTAGE

(75) Inventors: Fuw-Iuan Hshieh, Saratoga, CA (US); Brian Pratt, San Jose, CA (US)

(73) Assignee: Taurus Micropower, Inc., Saratoga, CA (US)

( * ) Notice: Subject to any disclaimer, the term of this patent is extended or adjusted under 35 U.S.C. 154(b) by 372 days.

(21) Appl. No.: 11/111,104

(22) Filed: Apr. 20, 2005

(65) Prior Publication Data
US 2006/0237813 A1  Oct. 26, 2006

(51) Int. Cl.
*H01L 29/47* (2006.01)
(52) U.S. Cl. ............... 257/471; 257/475; 257/E31.065
(58) Field of Classification Search .......... 257/155, 257/260, 449, 454, 471, 473, 475, 478, 484, 257/928, E51.009, E33.051, E31.065, E29.013; 438/92, 570
See application file for complete search history.

(56) References Cited

U.S. PATENT DOCUMENTS

| | | | |
|---|---|---|---|
| 4,149,174 A * | 4/1979 | Shannon ...................... 257/29 |
| 6,383,836 B2 * | 5/2002 | Fujihira et al. ................ 438/92 |
| 6,429,501 B1 * | 8/2002 | Tsuchitani et al. .......... 257/493 |
| 7,034,376 B2 * | 4/2006 | Okada et al. ................ 257/471 |

* cited by examiner

*Primary Examiner*—W. David Coleman
*Assistant Examiner*—Khiem D Nguyen
(74) *Attorney, Agent, or Firm*—Bo-In Lin

(57) ABSTRACT

This invention discloses a junction barrier Schottky device supported on a substrate that has a first conductivity type. The Schottky device includes a first diffusion region of a first conductivity type for functioning as a forward barrier height reduction region. The Schottky device further includes a second diffusion region of a second conductivity type disposed immediately adjacent to the first diffusion region for functioning as a backward blocking enhancement region to reduce the backward leakage current.

14 Claims, 23 Drawing Sheets

JUNCTION BARRIER SCHOTTKY WITH LOW FORWARD DROP AND IMPROVED REVERSE BLOCK VOLTAGE

BACKGROUND OF THE INVENTION

1. Field of the Invention

This invention relates generally to the structure and fabrication process for manufacturing the junction barrier Schottky device. More particularly, this invention relates to a novel device structure and fabrication process for manufacturing junction barrier Schottky with low forward voltage drop and improved reverse block voltage.

2. Description of the Prior Art

Even with excellent performance characteristics of a low forward voltage drop and fast reverse recovery period, the usefulness of a junction barrier Schottky device is still limited by several technical difficulties. A first technical limitation is the increase amount of reverse leakage current with the reduce junction barrier height. While a reduce junction barrier height provides an advantage of low forward conduction loss, it produces an associated side effect of increased reverse leakage current. Compared to common p-n junction diode, the poor reverse bias characteristics often become a limitation to the practical useful application of an Schottky device. Another limitation of the usefulness of the junction barrier Schottky is the silicon area it often requires to provide sufficient current when implemented as a rectifier as part of a power input device.

In order to improve the reverse bias characteristics of the Schottky device, Buchanan Jr. et al. disclose in a Statutory Invention Registration (SIR) H40 entitled "Field Shields for Schottky Barrier Devices", a method to reduce the reverse leakage current in a Schottky barrier device by forming one or more field shields with a P+ type diffusion. The field shields P+ type regions as that shown in FIG. 1A are formed right under the metal anode of the Schottky. The field shields are disposed with a pattern to reduce the surface electric field thereby reduces the reverse leakage current.

However, with the P+ field shields formed by P+ ion implantation followed by diffusion as that taught by Buchanan Jr., generates another difficulty as a significant portion of silicon areas are used due to the lateral diffusion of the P+ ions. The forward junction barrier is increased unless large silicon areas are allowed between the implanted P+ regions. For this reason, Buchanan's device would not be practical for application to electronic devices that require miniaturized power input device with a requirement of providing substantial amount of input current. The size of Schottky device implemented with P+ diffusion regions as that disclosed by Buchanan Jr. would become unfittingly oversized for application in miniaturized devices. Additionally, unless significant larger size Schottky devices are implemented, the forward barrier height would also be adversely affected due to the lateral diffusions of the P+ ions, that if not well controlled, could significantly reduces the forward conducting volume. Buchanan's device could encounter a similar difficulty of increasing the forward barrier height when forming the field shields by P+ diffusion near the top surface of the Schottky barrier device in attempt to increase the reverse block voltage.

FIGS. 1B and 1C are cross sectional view and a top view respectively of a junction barrier Schottky diode disclosed by another U.S. Pat. No. 6,524,900. FIG. 1B illustrates a method for controlling the temperature dependence of a junction barrier Schottky diode by first forming a plurality of P doped regions 4 as grid then adjusting the doping concentration of the drift layer regions 7 later with the drift regions 7 become a part of the grid portion. The drift layer 2 as a SiC semiconductor material of the diode may be epitaxially grown while introducing donors at a concentration of $10^{16}/cm^3$ until reaching the thickness where the grid portion is intended to start. The doping concentrations of these grid regions are adjusted to adjust the cross-over point at which the temperature coefficient changes from negative to positive for maintaining a substantially constant current density. The disclosure made in the U.S. Pat. No. 6,524,900 further explains that by forming the P+ doped region with larger lateral distance, the relation between the lateral cross section area of the drift layer regions 7 of the grid portion with respect to the total lateral cross section area of the diode will be increased resulting in a decrease of the resistance of the grid portion of the diode. However, as discussed above, even the U.S. Pat. No. 6,524,900 claims improvements of temperature stability such configuration increases the lateral dimension of the P+ doped regions thus increases the volume of the Schottky devices. The devices as disclosed in this Patent would have limitations of application for modern miniaturized devices require sources of power supply with reduced volumes.

Therefore, a need still exits in the art of design and manufacture of Schottky barrier device to provide a novel structural configuration and fabrication process that would resolve these difficulties. More specifically, it is preferably that the Schottky barrier device can achieve low forward barrier height with high reverse block voltage without a requirement to increase the volume of the Schottky device.

SUMMARY OF THE PRESENT INVENTION

It is therefore an object of the present invention to provide new device structures and manufacture methods by forming array of PN junctions as adjacent diffusion regions to reduce forward barrier heights while increasing reverse blocking voltage such that aforementioned limitations and difficulties as encountered in the prior art can be overcome.

Specifically, it is an object of the present invention to provide a new device structure and manufacture method to provide new device structures and manufacture methods by implanting and then simultaneous diffusion of P and N ions into a drift N region supported on a N+ substrate. The forward barrier height is reduced while the reverse blocking voltage is increased. Furthermore, with a double diffusion process by either simultaneous or sequential diffusing the P-type and N-type ions reduces the effects of the lateral diffusion thus reduces the lateral dimension of the Schottky devices. More compact junction barrier devices are formed with improved performance are achieved by the disclosures made in this invention.

Briefly, in a preferred embodiment, the present invention discloses a junction barrier Schottky device supported on a substrate that has a first conductivity type. The Schottky device includes a first semiconductor layer of a first conductivity type and a second semiconductor layer disposed above and having a lower impurity concentration of the first conductivity type than the first semiconductor layer. The device further includes a first diffusion region of the first conductivity type having a higher impurities concentration than the impurity concentration of the second semiconductor layer, for functioning as a forward barrier height reduction region. The Schottky device further includes a second diffusion region of a second conductivity type disposed adjacent to the first diffusion region for functioning as a backward blocking enhancement region and the first and second diffusion regions disposed above the second semiconductor layer. In another preferred embodiment, the Schottky device further includes a plurality of the first diffusion and second diffusion regions disposed alternately adjacent to each other. In another preferred embodiment, the Schottky device further includes a plurality of the first diffusion and second diffusion regions disposed alternately adjacent to each other having a prescribed width as a prescribed interval between either of said first and second diffusion regions.

The present invention also discloses a method for configuring a junction barrier Schottky device on a substrate that has a first and second semiconductor layers of a first conductivity wherein the second semiconductor layer disposed above and having a lower impurity concentration than the first semiconductor layer. The method includes a step of doping and diffusing a first diffusion region with a higher impurity concentration of the first conductivity into the second semiconductor layer for functioning as a forward barrier height reduction region. The method further includes a step of doping and diffusing into the second semiconductor layer a second diffusion region of a second conductivity type for functioning as a backward blocking enhancement region.

These and other objects and advantages of the present invention will no doubt become obvious to those of ordinary skill in the art after having read the following detailed description of the preferred embodiment, which is illustrated in the various drawing figures.

DETAILED DESCRIPTION OF THE PREFERRED EMBODIMENT

Figure 1A:
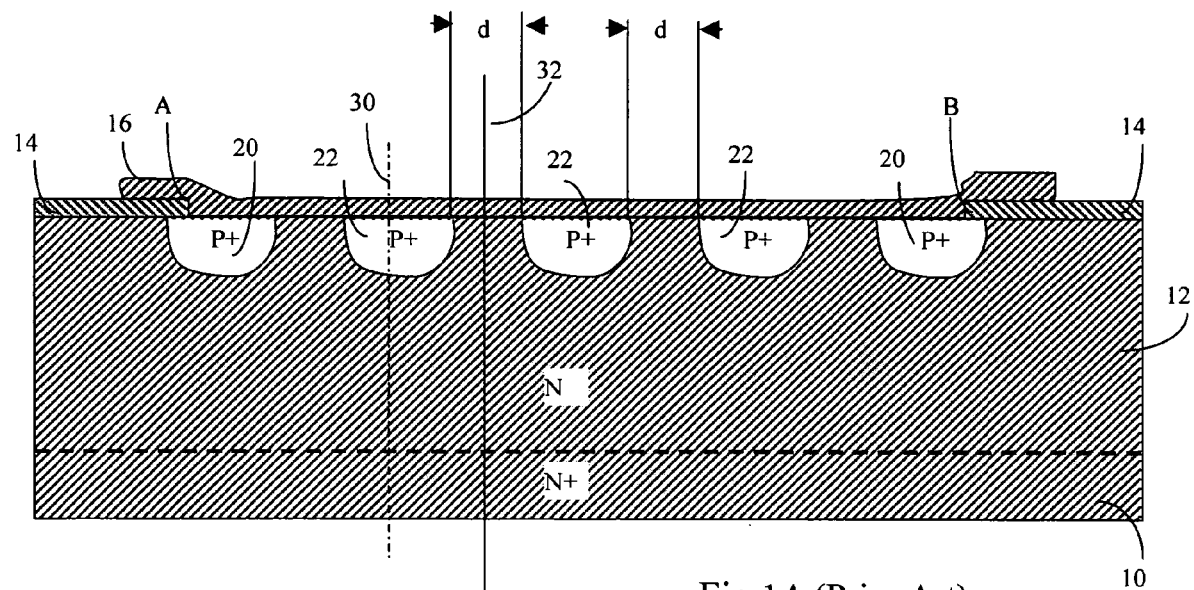
FIG. 1A is a side cross sectional view of a prior art Schottky barrier device with a field shield.
Figure 1B:
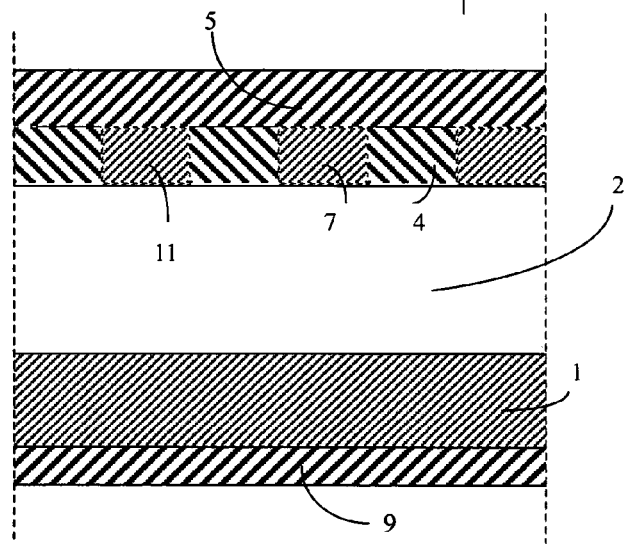
FIG. 1B and 1C are a cross sectional view and a top view of another prior art junction barrier Schottky device.
Figure 1C:
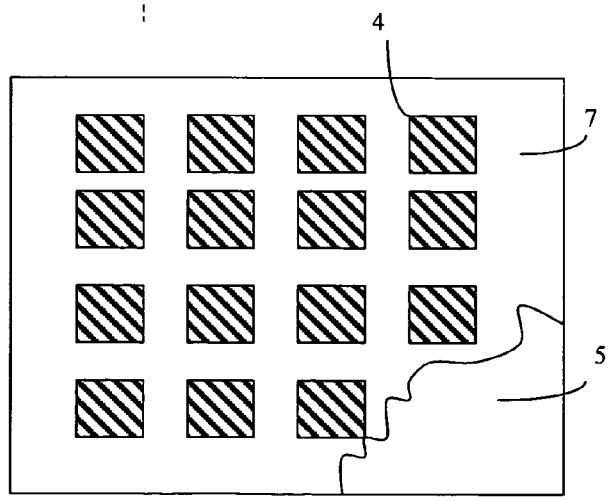
Figure 2:
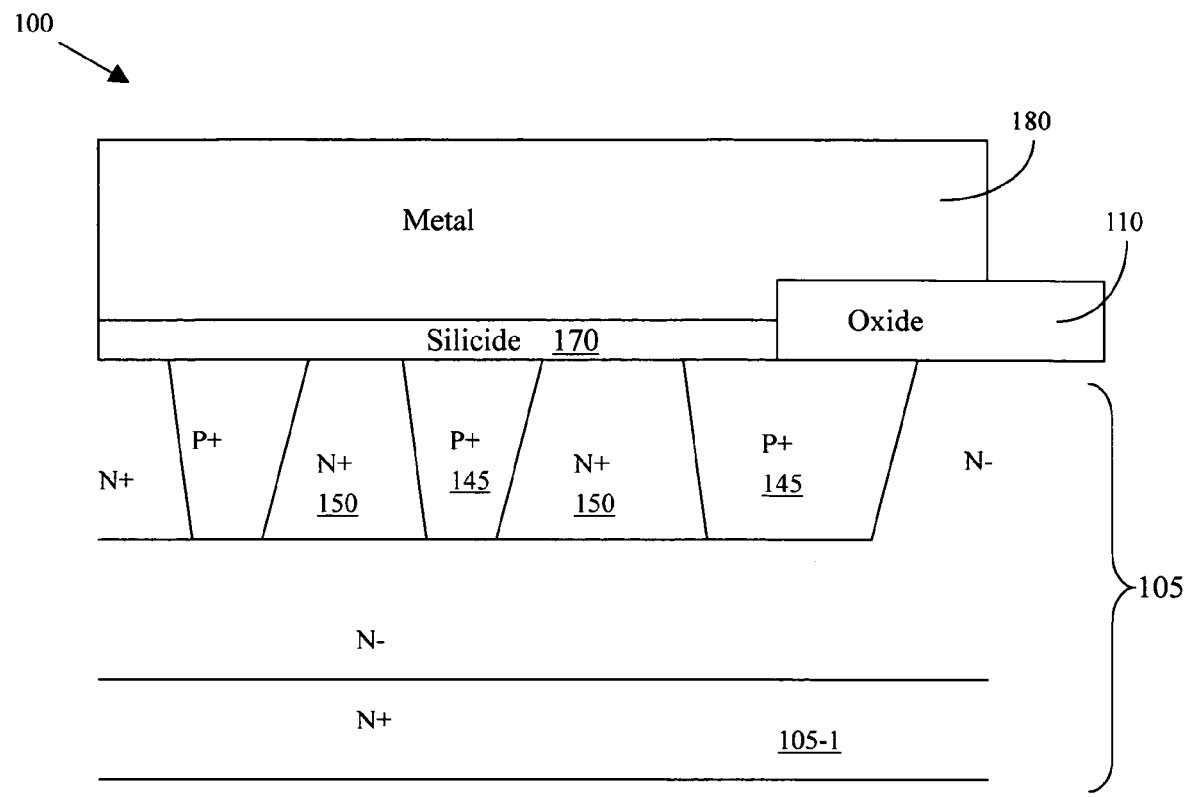
FIG. 2 is a cross sectional view of a N+ diffusion Schottky device of this invention.

Referring now to FIG. 2 for a cross-sectional illustration of a first embodiment of a Schottky junction barrier device according to the present invention. The Schottky junction barrier device 100 is supported on a semiconductor substrate 105 of first conductivity type, typically N-type conductivity, having a first semiconductor layer 105-1 shown as N+ region and a second semiconductor layer 105-2 shown as N– region with impurity concentration lower than that of the first semiconductor layer 105-1. The Schottky junction barrier device further includes a metal layer 180 and a silicide layer 170 as Schottky contact to function as an anode of a diode. The junction barrier Schottky device further includes a plurality of P+ and N+ diffusion regions 145 and 150 respectively disposed adjacent to each other with prescribed width and intervals in an alternate sequence. The N+ diffusion regions 150 function as forward barrier reduction region while the P+ diffusion regions 145 function as backward blocking voltage increasing regions to increase the backward blocking voltage or reduce reverse leakage current. The thick oxide shown as 110 serves as dielectric layer of field oxide plate to enhance avalanche breakdown voltage in termination area.

Figure 3A:
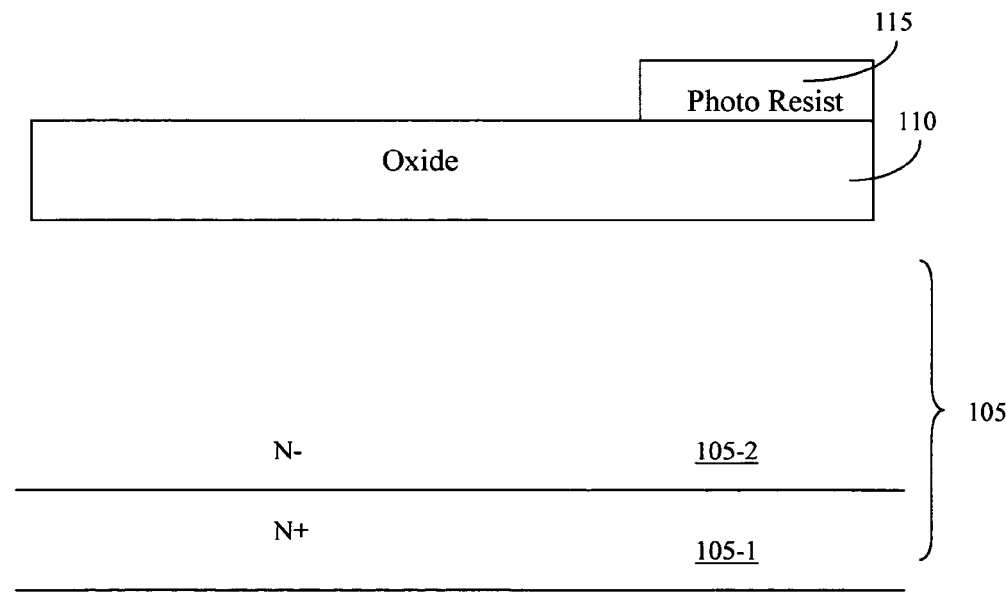
FIGS. 3A to 3K are a series of cross sectional views for showing the manufacturing processes for making a device of FIG. 2.
Figure 3B:
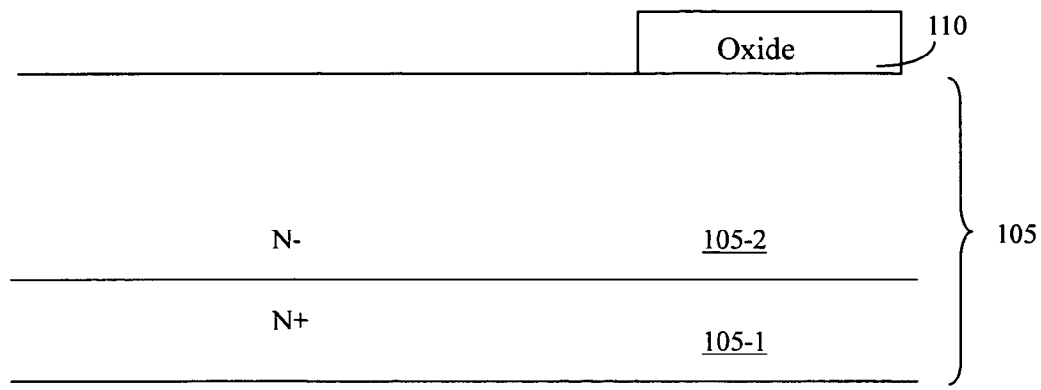
Figure 3C:
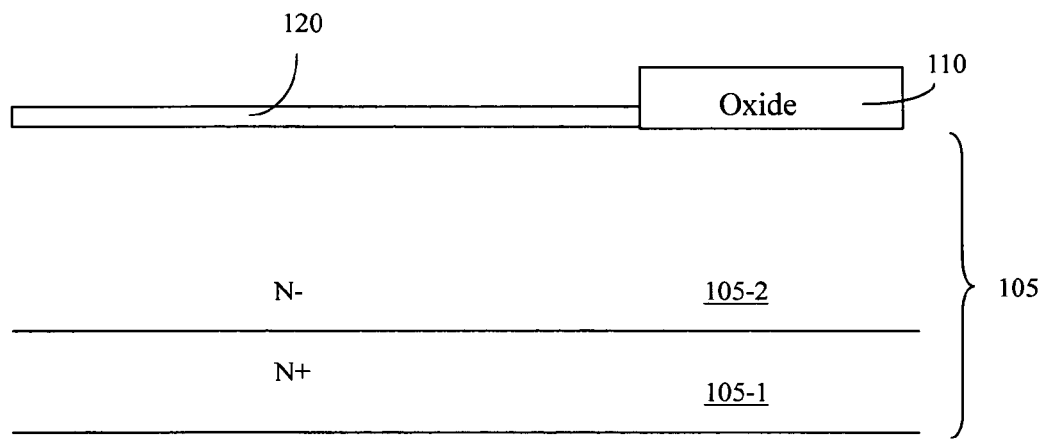
Figure 3D:
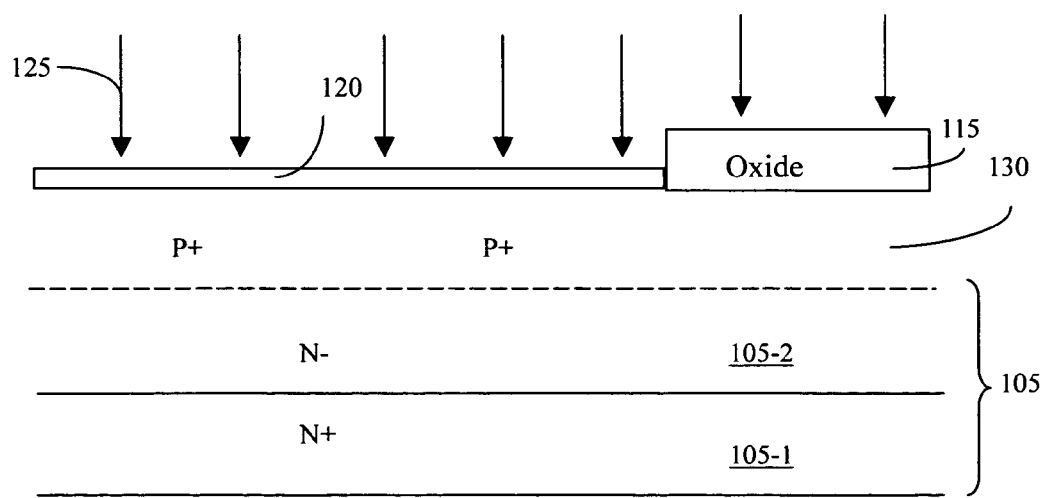
Figure 3E:
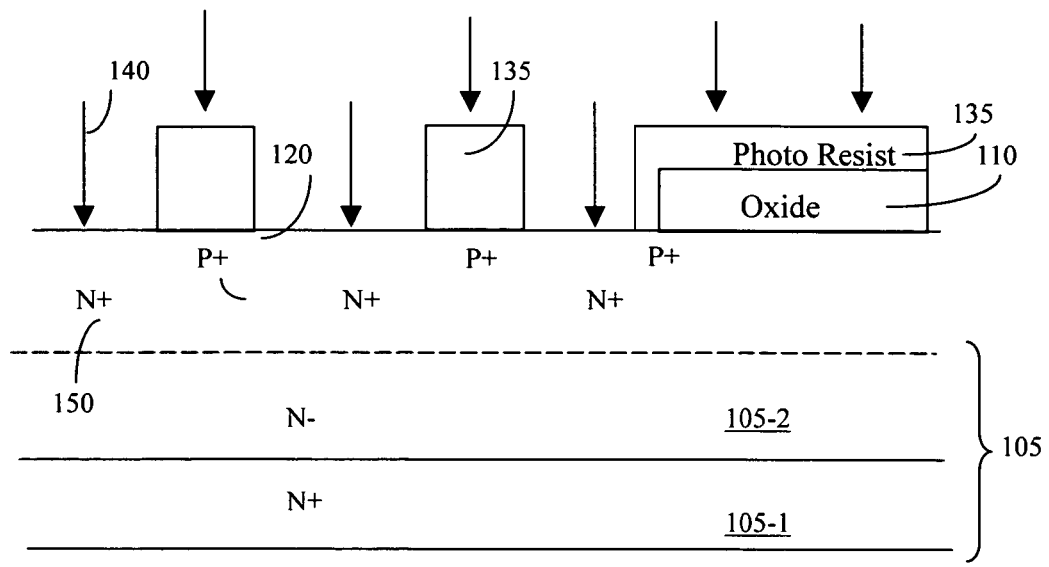
Figure 3F:
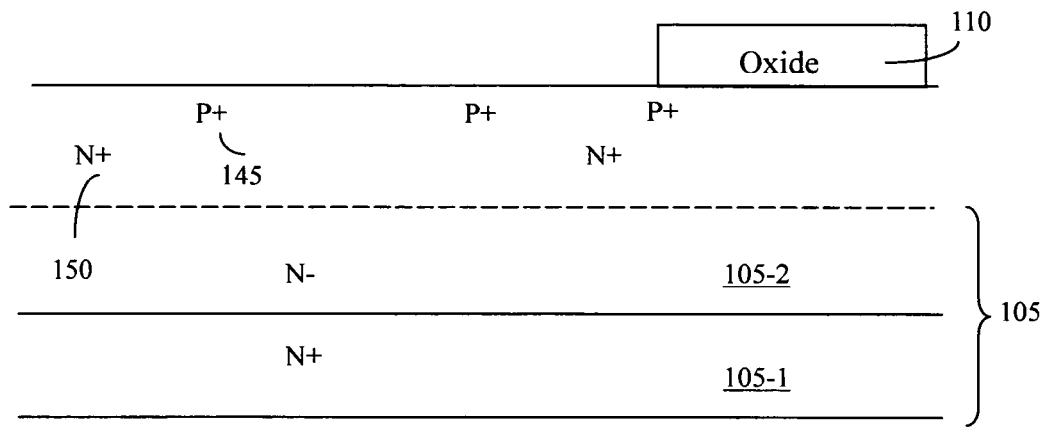
Figure 3G:
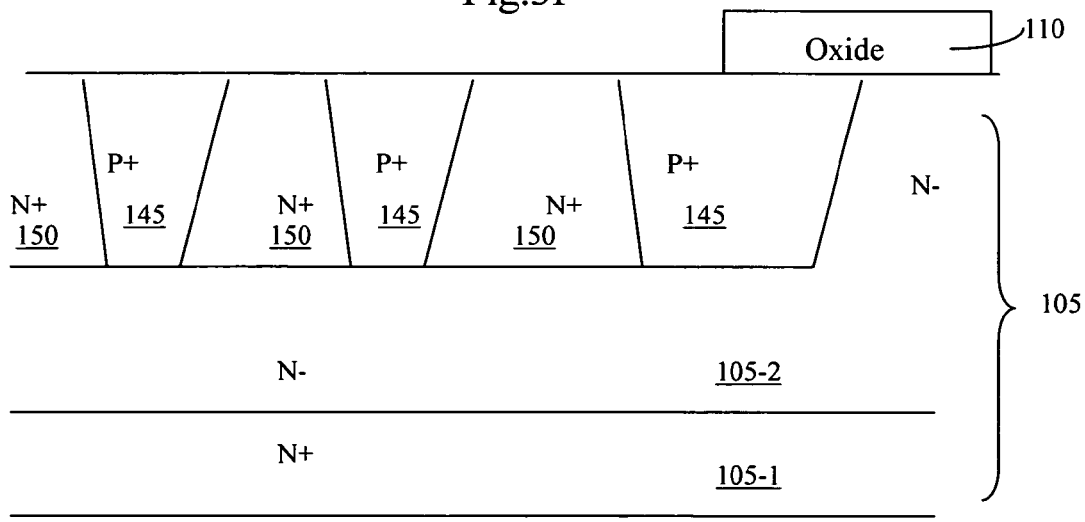
Figure 3H:
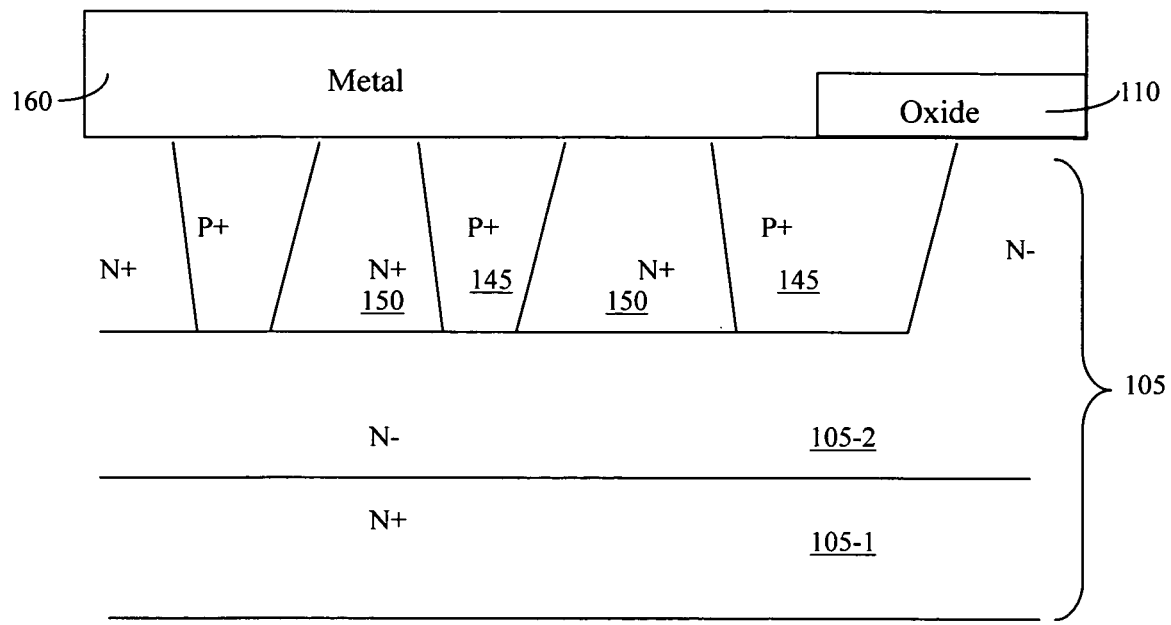
Figure 3I:
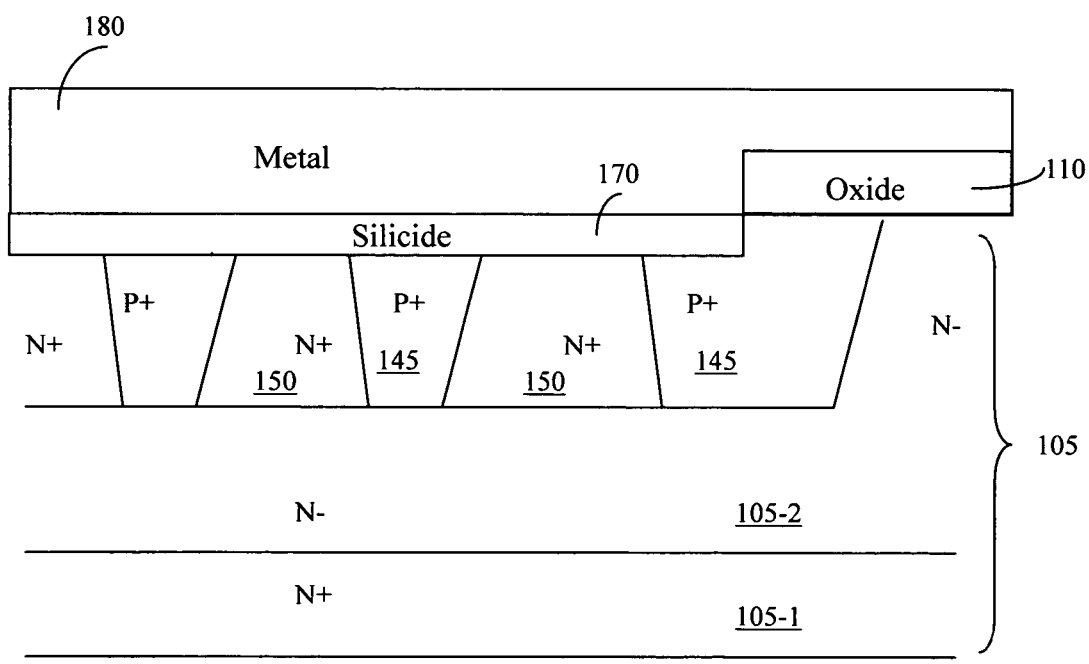
Figure 3J:
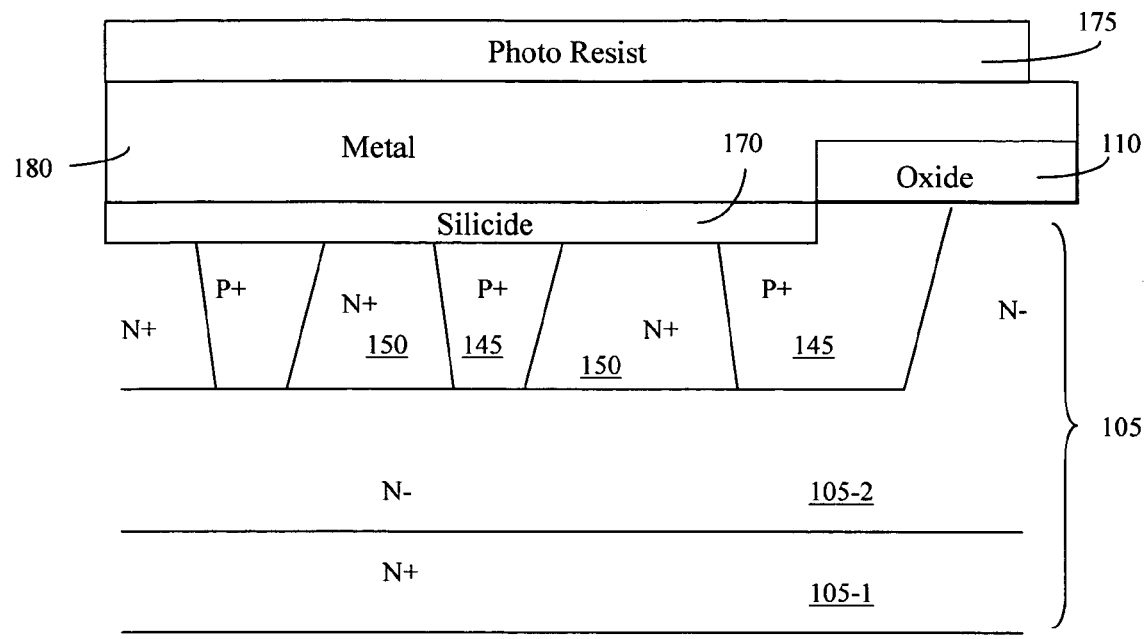
Figure 3K:
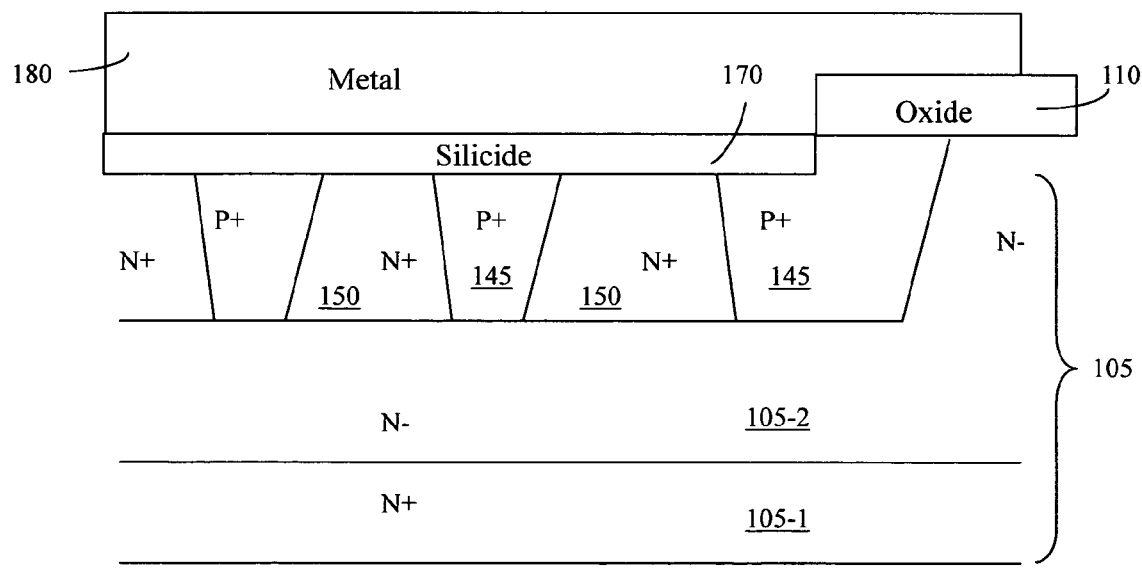

Referring to FIGS. 3A to 3K for a series of cross sectional views to show the processing steps for manufacturing a Schottky junction barrier device as that shown in FIG. 2. The process begins with an initial step of oxidation by applying a temperature ranging from 900° C.-1150° C. to a substrate 105 to that includes a N+ bottom layer 105-1 and a top N– layer 105-2. An oxide layer 110 with a layer thickness of 1000 to 10,000 Angstroms is formed on top of the substrate 105. A thermal oxidation is preferred for surface Si/SiO2 interface charge. The oxide layer 110 is necessary for the field oxide plate termination to withstand the operating voltage and also allows for an etch back step to serve as ion implantation mask which will be further described below. A photoresist 115 is then formed on top of the oxide layer 110 followed by an oxide etch and photoresist removal as shown in FIG. 3B. FIG. 3C shows a pad oxidation layer 120 is formed at a temperature around 850° C. in dry or steam environment with a thickness of about 200-500 A Angstroms for the purpose of minimizing silicon damages during the subsequent ion implantations. In FIG. 3D, the substrate is implanted with P+ ions 125 of boron at an energy of 30-100 Kev and an ion dose ranging from $5 \times 10^{12}/cm^2$ to $5 \times 10^{14}/cm^2$ thus forming a P+ layer 130. Referring to FIG. 3E, a N+ photoresist 135 is applied followed by a N+ implant with phosphorous-31 ions 140 at an energy of approximately 80 Kev and an ion dose ranging from $8.0 \times 10^{12}/cm^2$ to $8.0 \times 10^{14}/cm^2$. The P+ layer 130 thus develops a plurality of P+ and N+ regions 145 and 150 followed by the removal of the photoresist 135 as that shown in FIG. 3F. Referring to FIG. 3G where a process of simultaneous drive of the P+ and N+ regions 145 and 150 respectively is performed by applying a temperature around 1050° C.-1150° C. for about 30 minutes to 10 hours to a depth of approximately 0.5 to 10 micrometers. The P+ and N+ diffusion process is carried out in an ambient condition of cycled N2, O2 and HCl for the purpose of reducing the surface stress and surface defects during the elevated temperature condition. A thin oxide layer of about 200-1000 Angstroms is grown and an oxide etch back is performed to remove the oxide layer. In FIG. 3H, a barrier metal layer 160 that includes Titanium (Ti), Ti/TiN, Nichrome(Ni), Plantium(Pt), Molybrium(Mo), or NiPt combination, etc. having a total thickness greater than 0.2 micrometers is formed on top of the surface. In FIG. 3I, A barrier layer sintering process is carried out at a temperature between 400° to 700° C. for 30 to 60 minutes or Rapid thermal Anneal at temperatures between 400° to 800° C. for 10 to 60 sec in an ambient nitrogen condition. A silicide layer 170 is then formed underneath the barrier layer 160. The remaining unreactive barrier of the barrier layer 160 is removed with Aqua Rega. A thick metal 180 with thickness greater than 10 KA, such as Aluminum (Al), or Al/Si/Cu, or Al/Si, or Al/Cu, or Ti/Ni/Ag is deposited. In FIG. 3J, a photoresist 175 is applied over the thick metal layer 180 then a metal etch process is performed, and the photoresist layer 175 is removed as that shown in FIG. 3K.

Figure 4A:
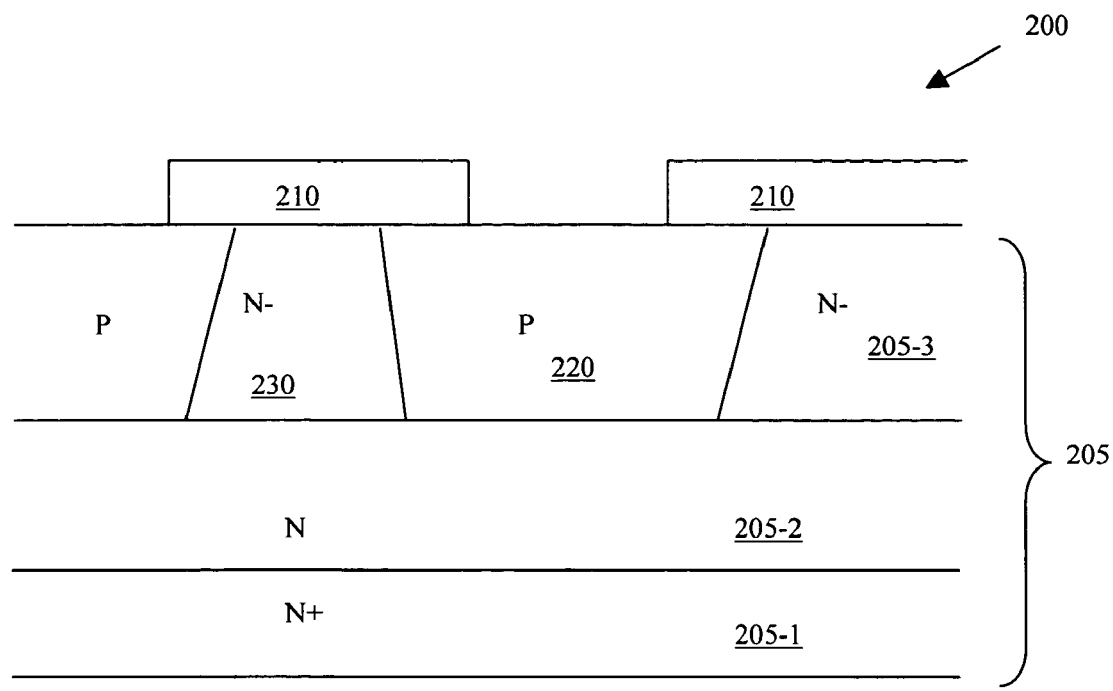
FIGS. 4A to 4C shows a series of cross sectional views for illustrating the processing steps for manufacturing an alternate preferred embodiment of this invention.
Figure 4B:
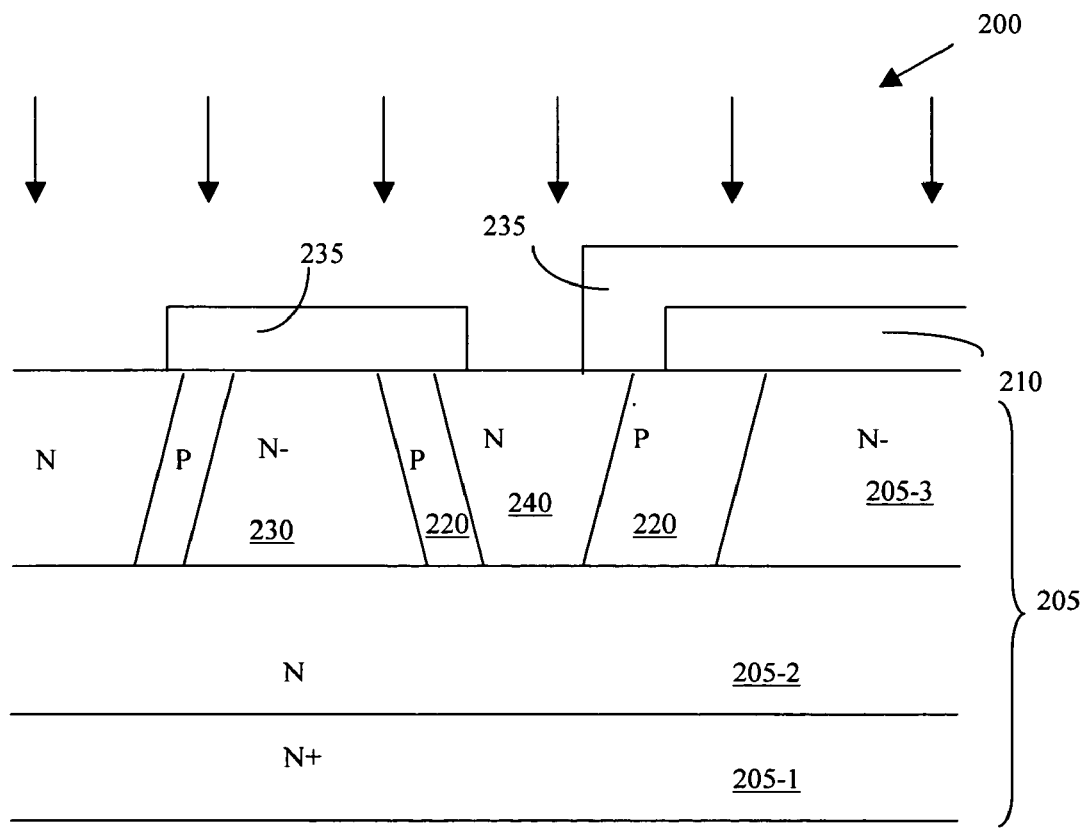
Figure 4C:
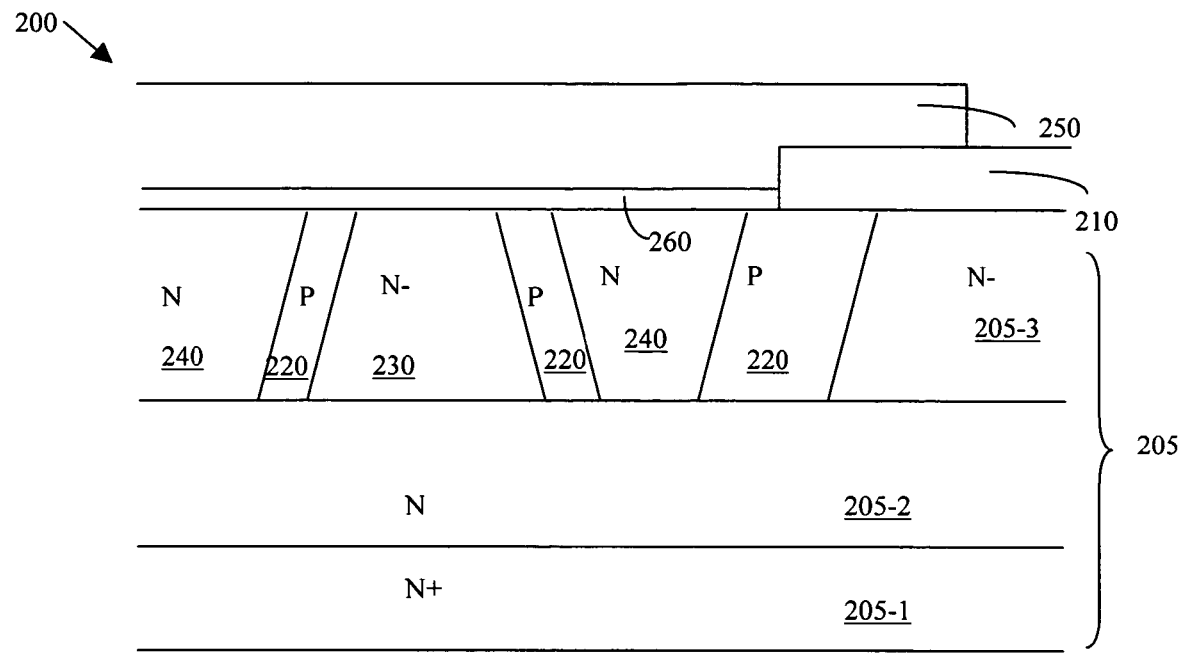

Referring to FIGS. 4A to 4C for a set of different processing steps for making another embodiment of this invention. In FIG. 4A, a substrate 200 having a N+ bottom layer 205-1 and a N drift layer 205-2 above the N+ bottom layer and a light doped N− layer 205-3 is first deposited with initial oxide layer 210. A P mask (not shown) is applied to etch the initial oxide layer and a boron implantation is carried out follow by a diffusion to develop P regions 220 and N− regions 230 above the drift region 205-2. In FIG. 4B, an N mask 235 is applied followed by an N ion implant of phosphorous or arsenide ions followed by a diffusion to developed N regions 240 surrounded by the shrunk P region 220. In FIG. 4C, the N-mask 235 is removed. A contact mask (not shown) is applied to etch the oxide layer (not shown since the details are similar to FIGS. 3H to 3K above) followed by a silicide formation of a silicide layer 260. A metal deposition is performed followed by applying a metal mask (not shown) then the metal layer 250 is etched to complete the manufacturing processes.

Figure 5A:
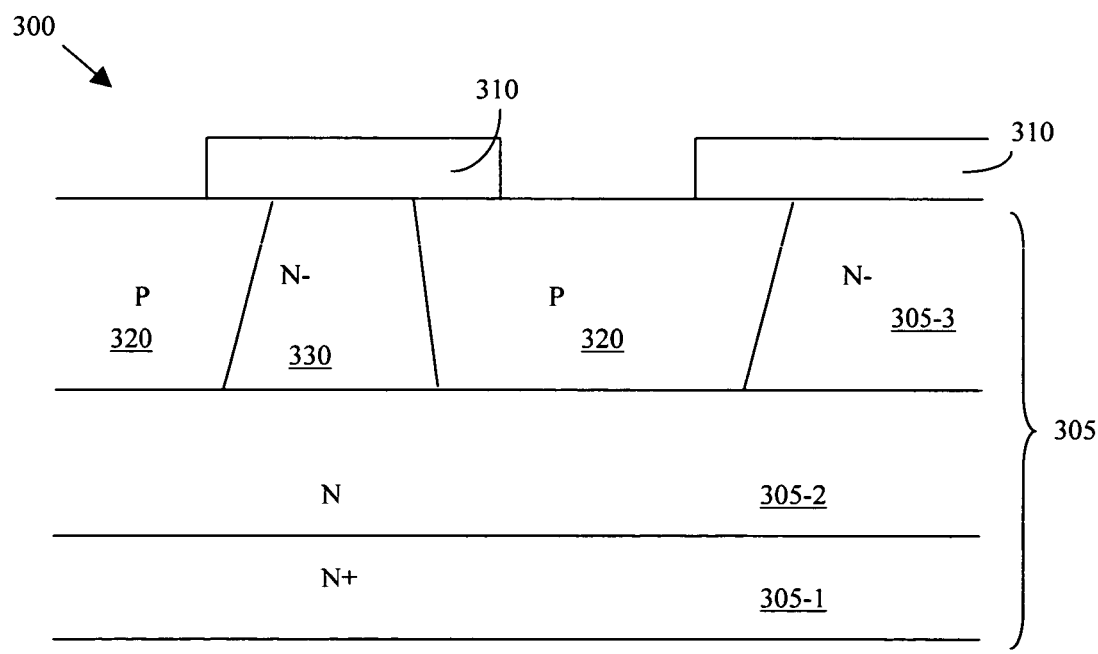
FIGS. 5A to 5C shows a series of cross sectional views for illustrating the processing steps for manufacturing an alternate preferred embodiment of this invention.
Figure 5B:
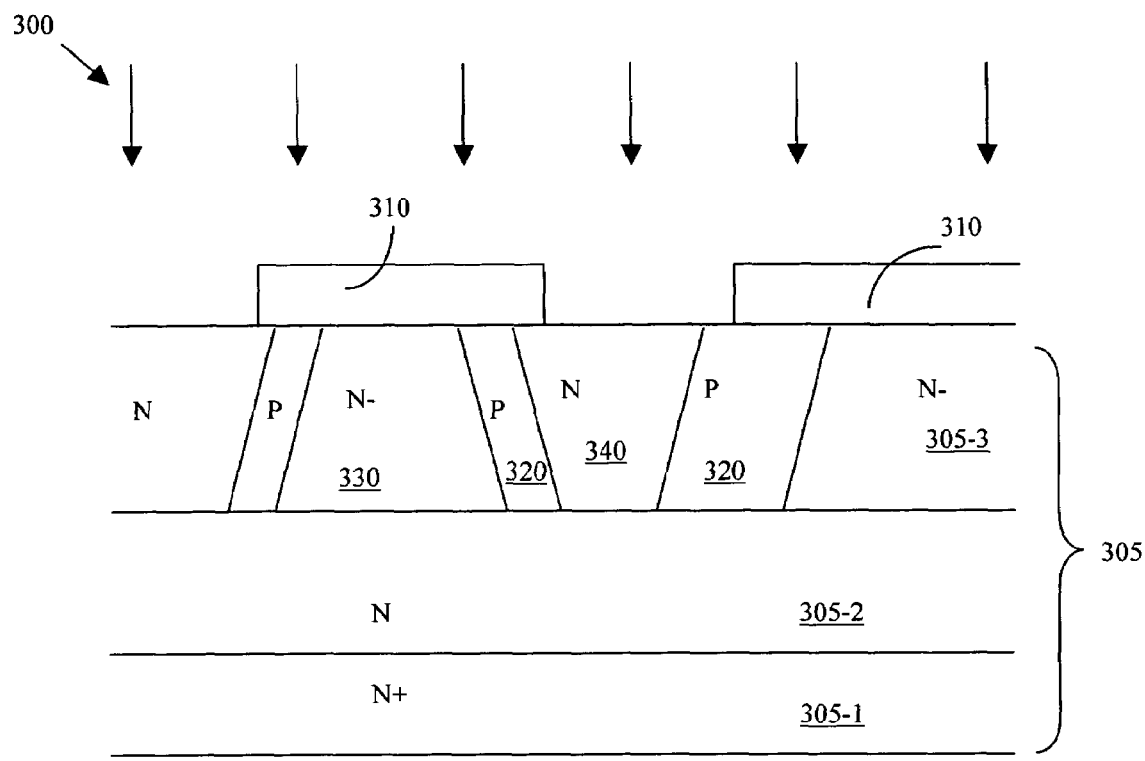
Figure 5C:
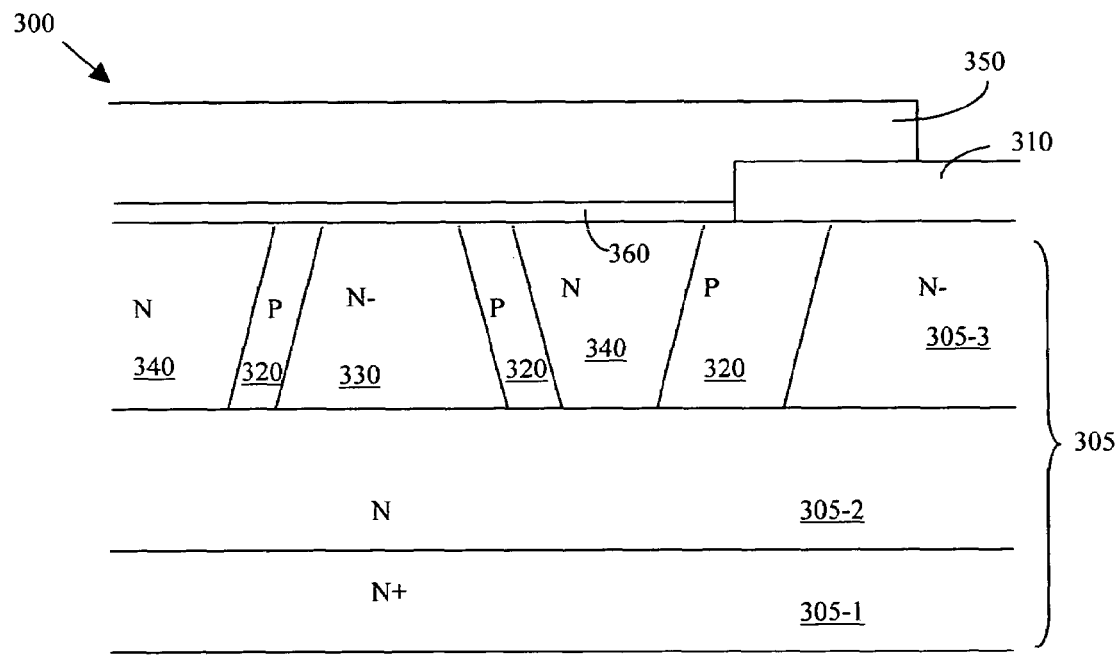

Referring to FIGS. 5A to 5C for a set of different processing steps for making another embodiment of this invention. In FIG. 5A, a substrate 305 having a N+ bottom layer 305-1 and a N drift layer 305-2 above the N+ bottom layer and a light doped N− layer 305-3 is first deposited with initial oxide layer 310. A P mask (not shown) is applied to etch the initial oxide layer and a boron implantation is carried out follow by a diffusion to develop P regions 320 surrounded by intermediate N− regions 330 above the drift region 305-2. In FIG. 5B, an N mask 335 is applied followed by an N ion implant of phosphorous or arsenide ions followed by a diffusion to developed N regions 340 surrounded by the shrunk P region 320. The N-mask 335 does not cover the field oxide 310. As a result of the N-implant the P-region 320 underneath the field oxide 320 has also become a shrunk P-region. In FIG. 5C, the N-mask 335 is removed. A contact mask (not shown) is applied to etch the oxide layer (not shown since the details are similar to FIGS. 3H to 3K above) followed by a silicide formation. A metal deposition is performed followed by applying a metal mask (not shown) then the metal layer 350 is etched to complete the manufacturing processes.

Figure 6:
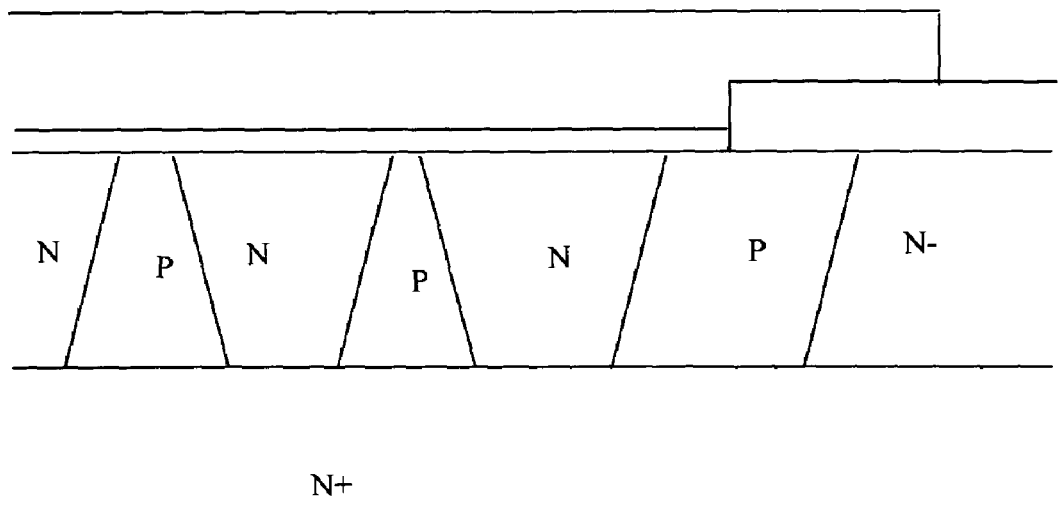
FIGS. 6 to 8 are different preferred embodiments of this invention similar to the devices shown in FIGS. 2, 4C and 5C manufactured on a substrate having single N–epitaxial layer.
Figure 7:
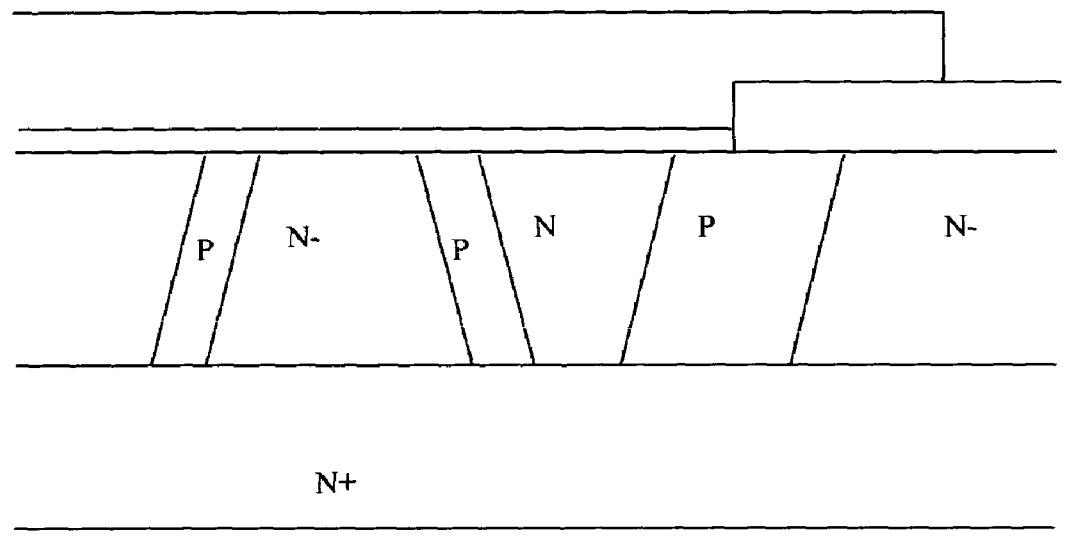
Figure 8:
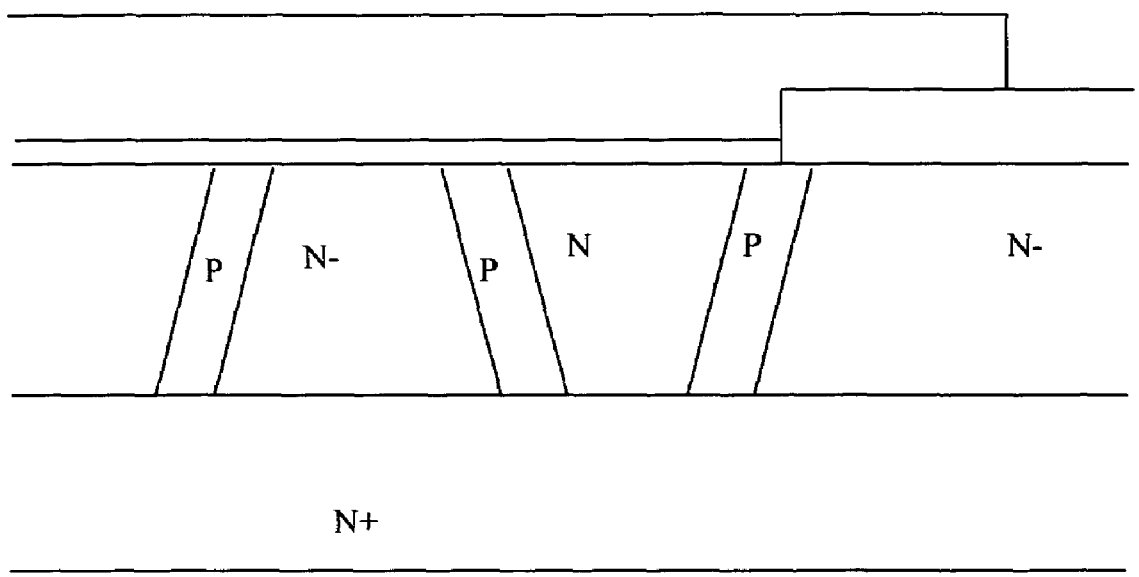

FIGS. 6, 7 and 8 are junction barrier Schottky devices manufactured by similar processes and having similar layer structures and device configurations as the devices shown in FIGS. 2, 4C and 5C respectively. Compared to the Schottky devices as shown in FIGS. 2, 4C and 5C, the only difference of the Schottky devices as that shown in FIGS. 6, 7, and 8, is that the Schottky devices shown in FIGS. 6, 7, and 8 do not have buffer layers such as N− in FIG. 2 or N in FIGS. 4C and 5C sandwiched between N+ substrate and alternately PN or PN-PN layer, which is diffused through the N− epitaxial region and touched to the N+ substrate.

Figure 9A:
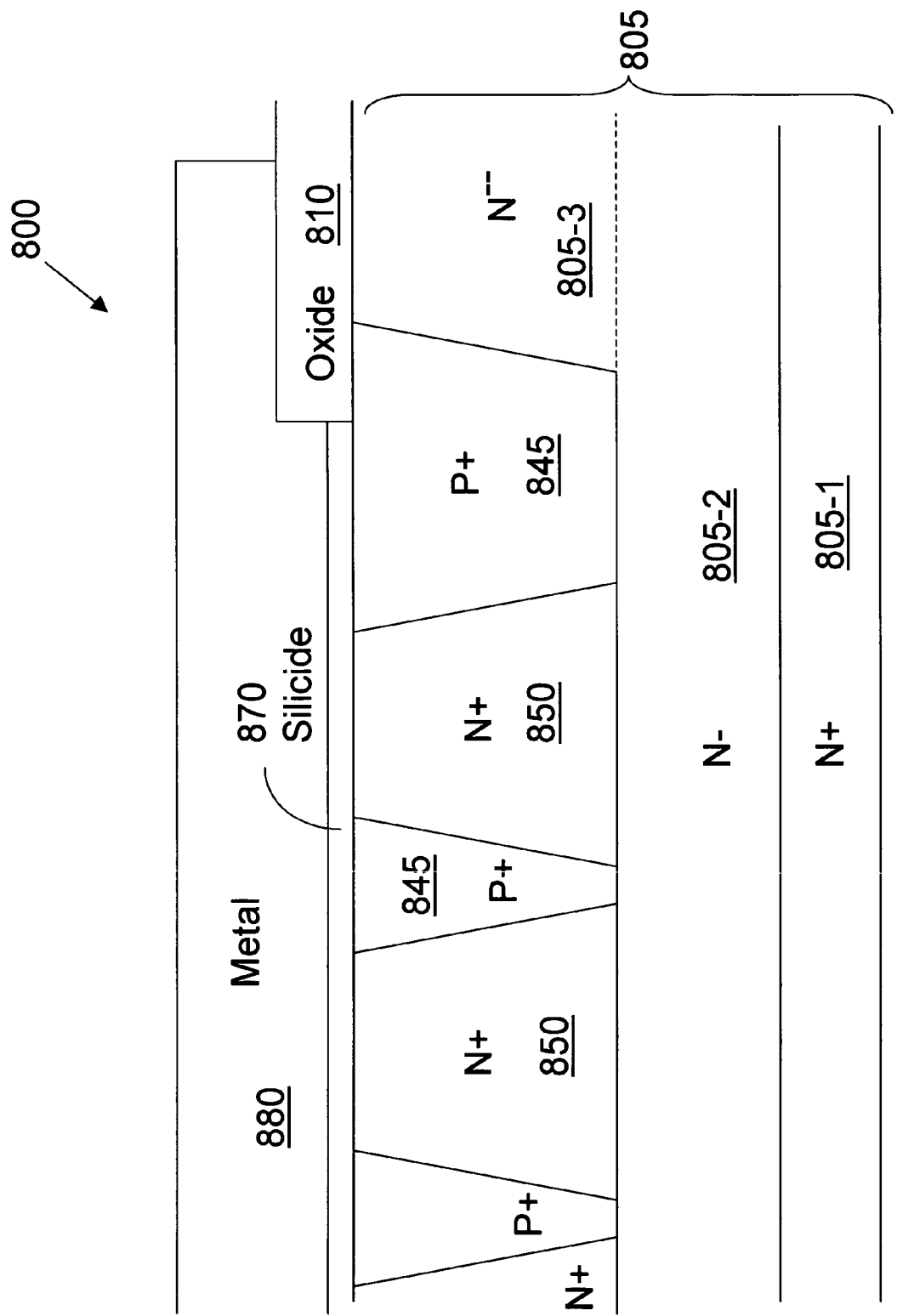
FIG. 9A is shows a cross sectional view of another embodiment of this invention where a Schottky device is supported on a substrate have two-epitaxial layers of further reduced dopant concentration for a top epi-layer to achieve better performance for high voltage rectifiers.
Figure 9B:
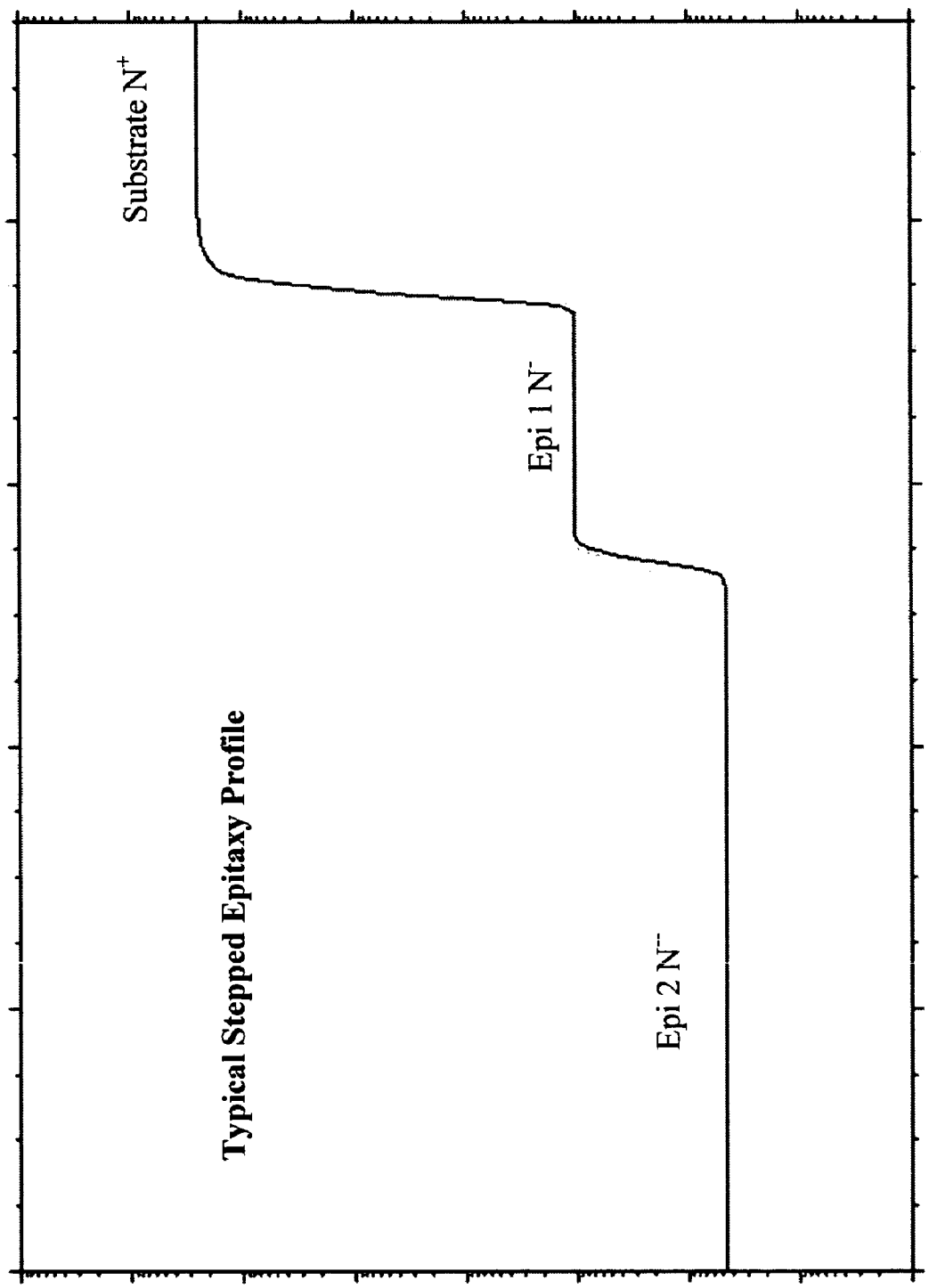
FIG. 9B shows the dopant concentration profile of a substrate supporting two epitaxial layers as that illustrated in FIG. 9A.

Referring now to FIG. 9A for a cross-sectional illustration of another embodiment of a Schottky junction barrier device according to the present invention. The Schottky junction barrier device 800 is supported on a semiconductor substrate 805 provided with a first conductivity type, e.g., an N-type impurity concentrations shown in FIG. 9B. The bottom layer is shown in FIGS. 9A and 9B as a first semiconductor layer 805-1 illustrated as N+ region, a second semiconductor layer 805-2 shown as N− region, and a third semiconductor layer shown as N−−layer with impurity concentration lower than that of the first semiconductor layer 805-1 and 805-2 (Referring to FIG. 9B). The Schottky junction barrier device further includes a metal layer 880 and a silicide layer 870 as Schottky contact to function as an anode of a diode. The junction barrier Schottky device further includes a plurality of P+ and N+ diffusion regions 845 and 850 respectively disposed adjacent to each other with prescribed width and intervals in an alternate sequence. The N+ diffusion regions 850 function as forward barrier reduction region while the P+ diffusion regions 845 function as backward blocking voltage increasing regions to increase the backward blocking voltage or reduce reverse leakage current. The thick oxide shown as 810 serves as dielectric layer of field oxide plate to enhance avalanche breakdown voltage in termination area. The Schottky junction barrier device 800 has special advantages (Please add here the advantages of this embodiment).

Figure 10A:
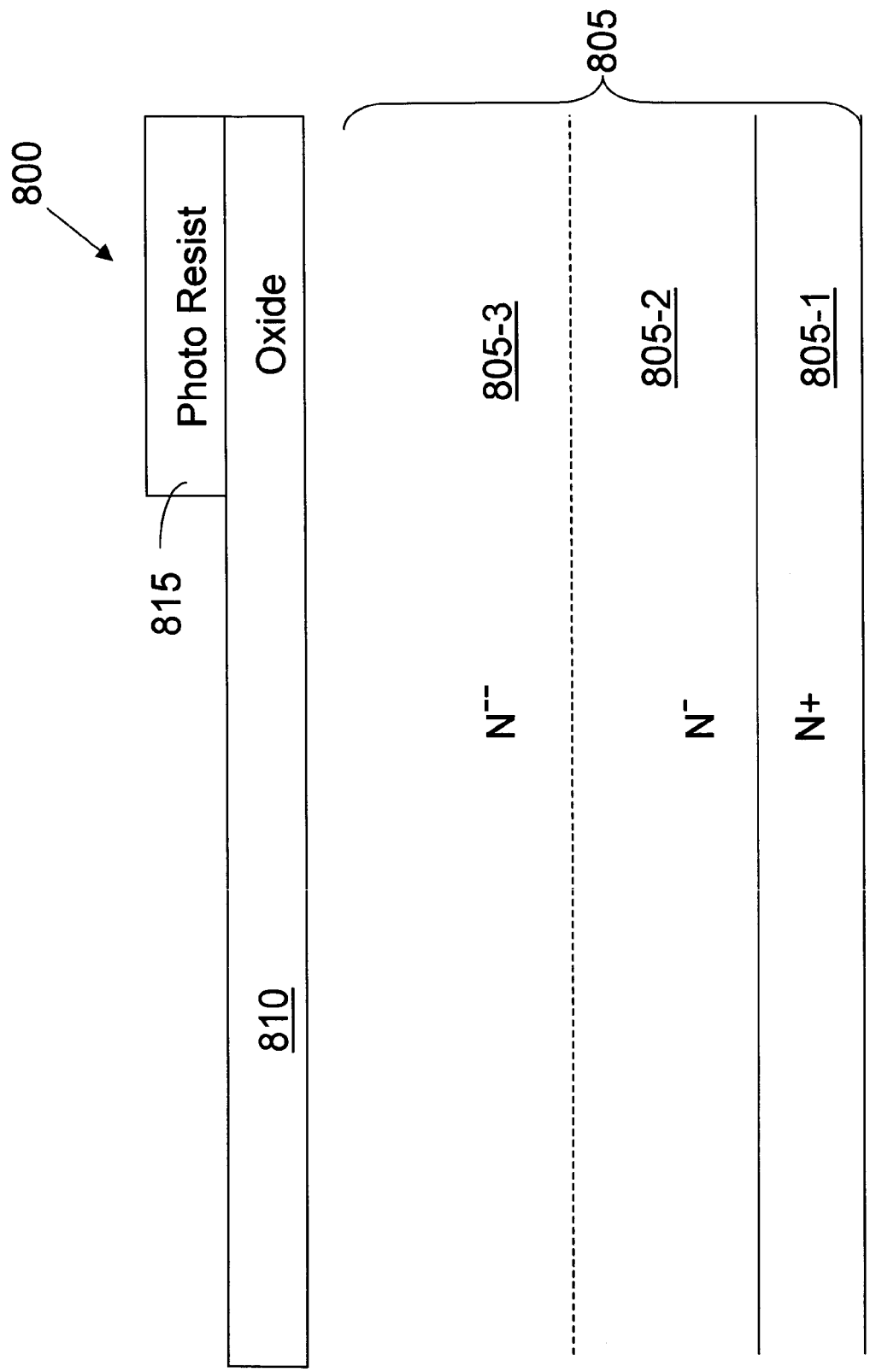
FIGS. 10A to 10J are a series of cross sectional views for showing the manufacturing processes for making a device of FIG. 9A.
Figure 10B:
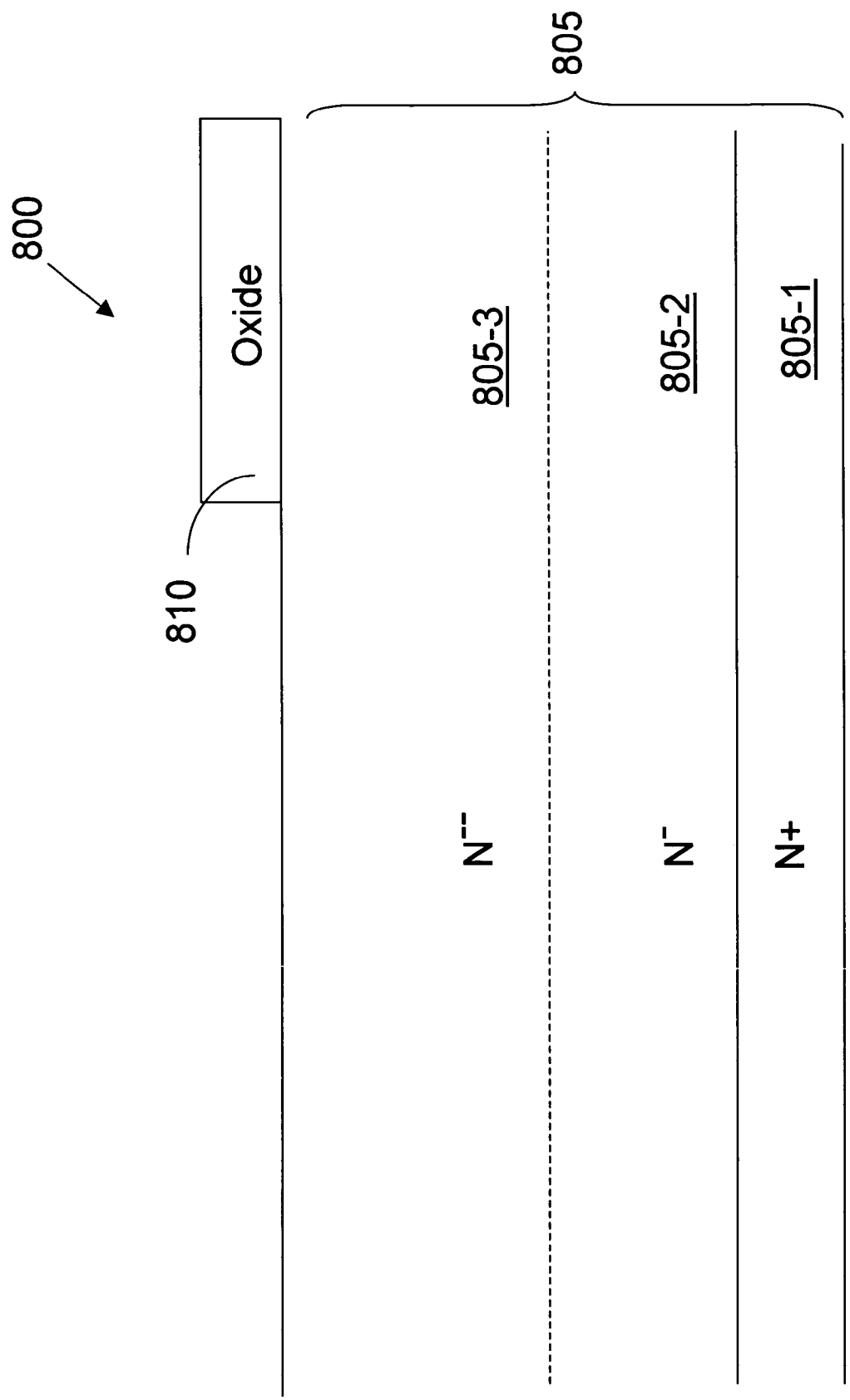
Figure 10C:
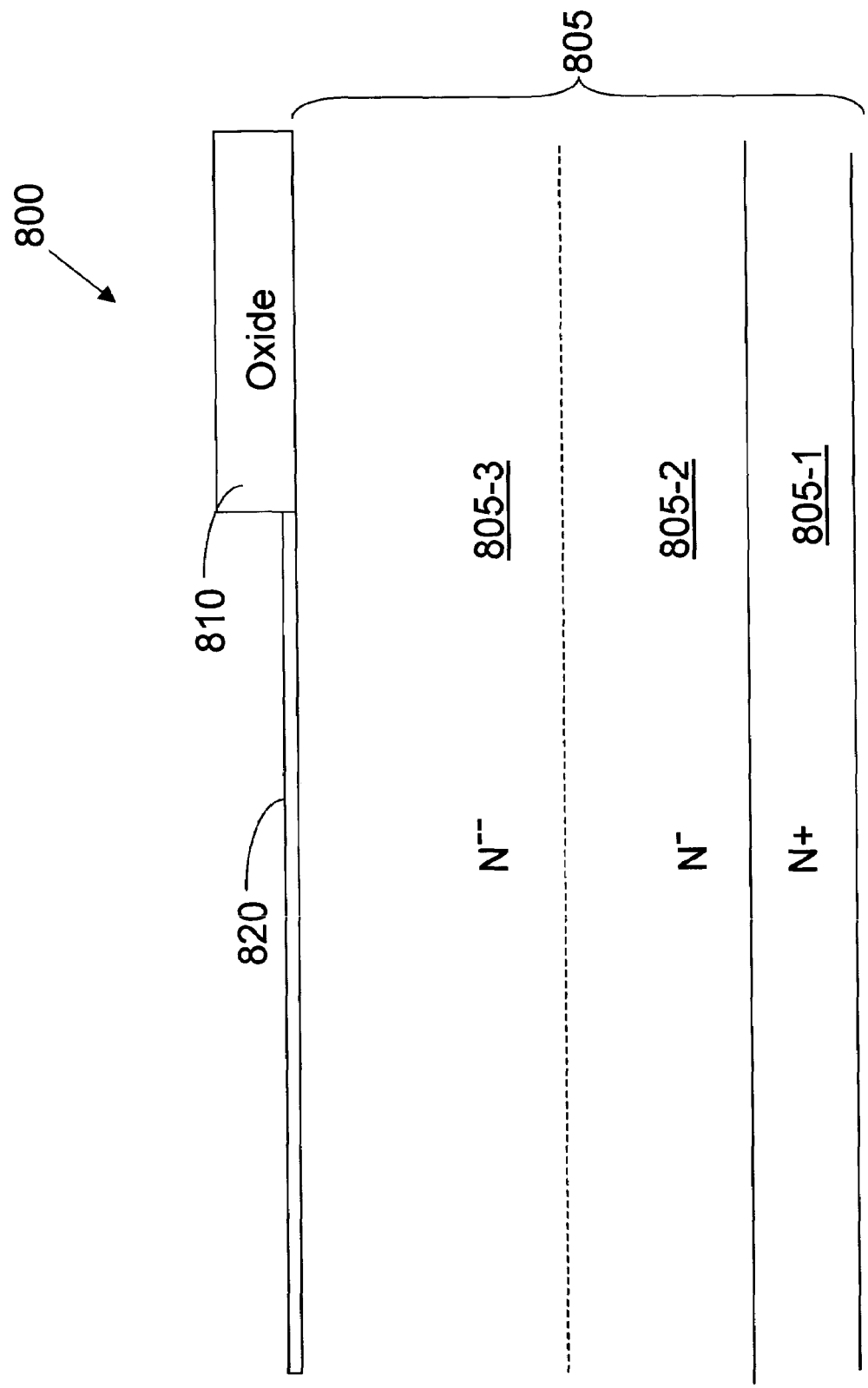
Figure 10D:
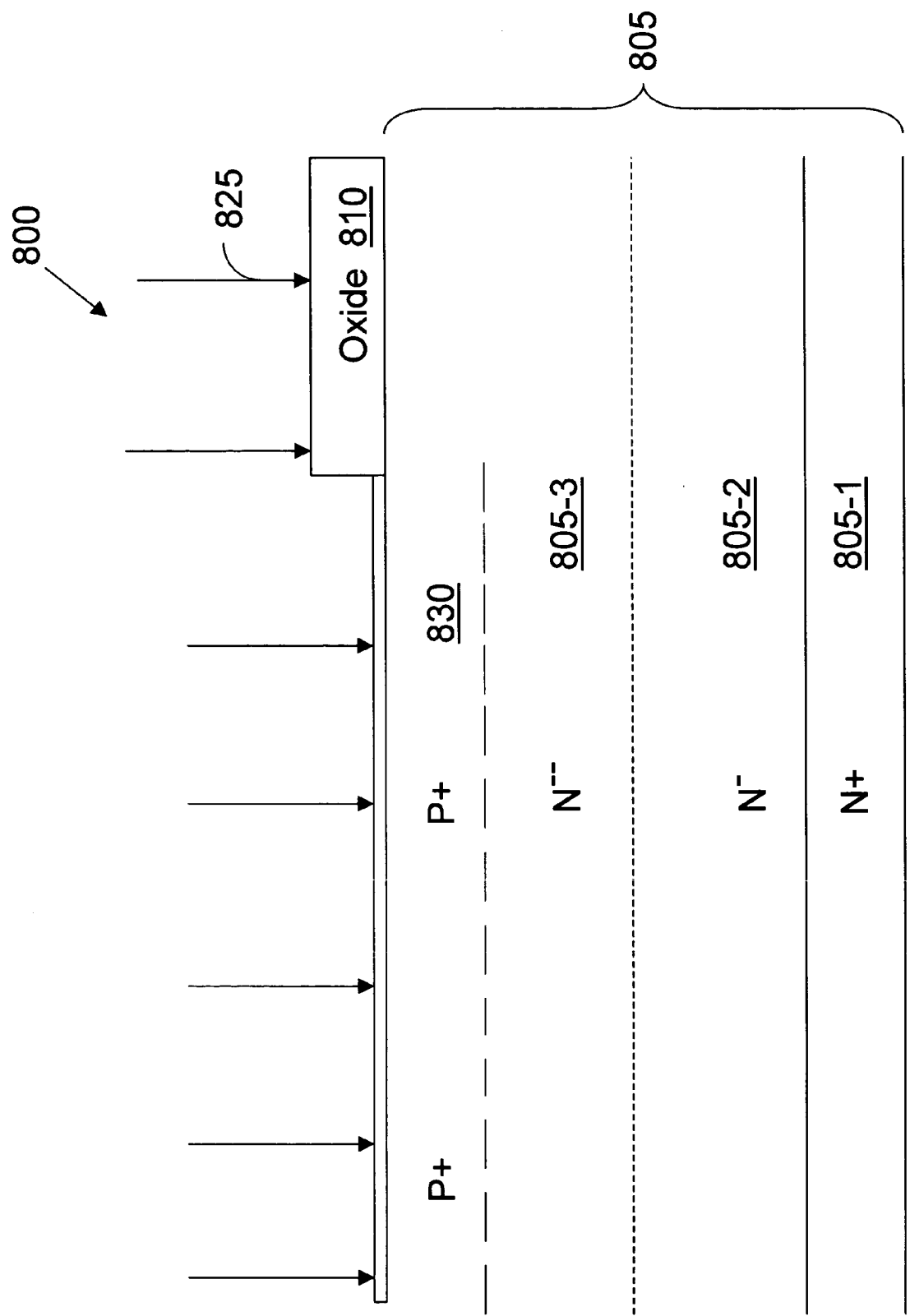
Figure 10E:
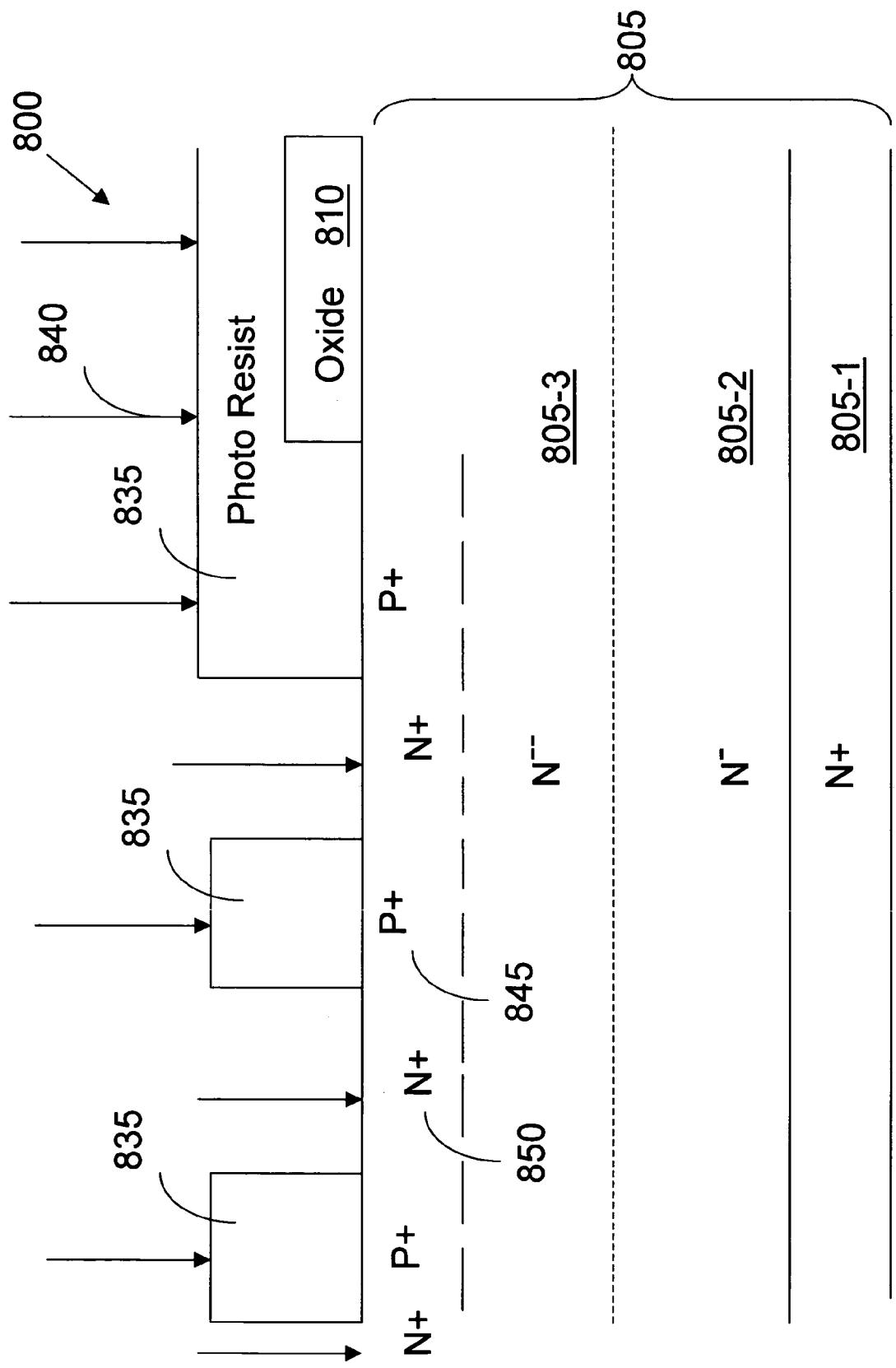
Figure 10F:
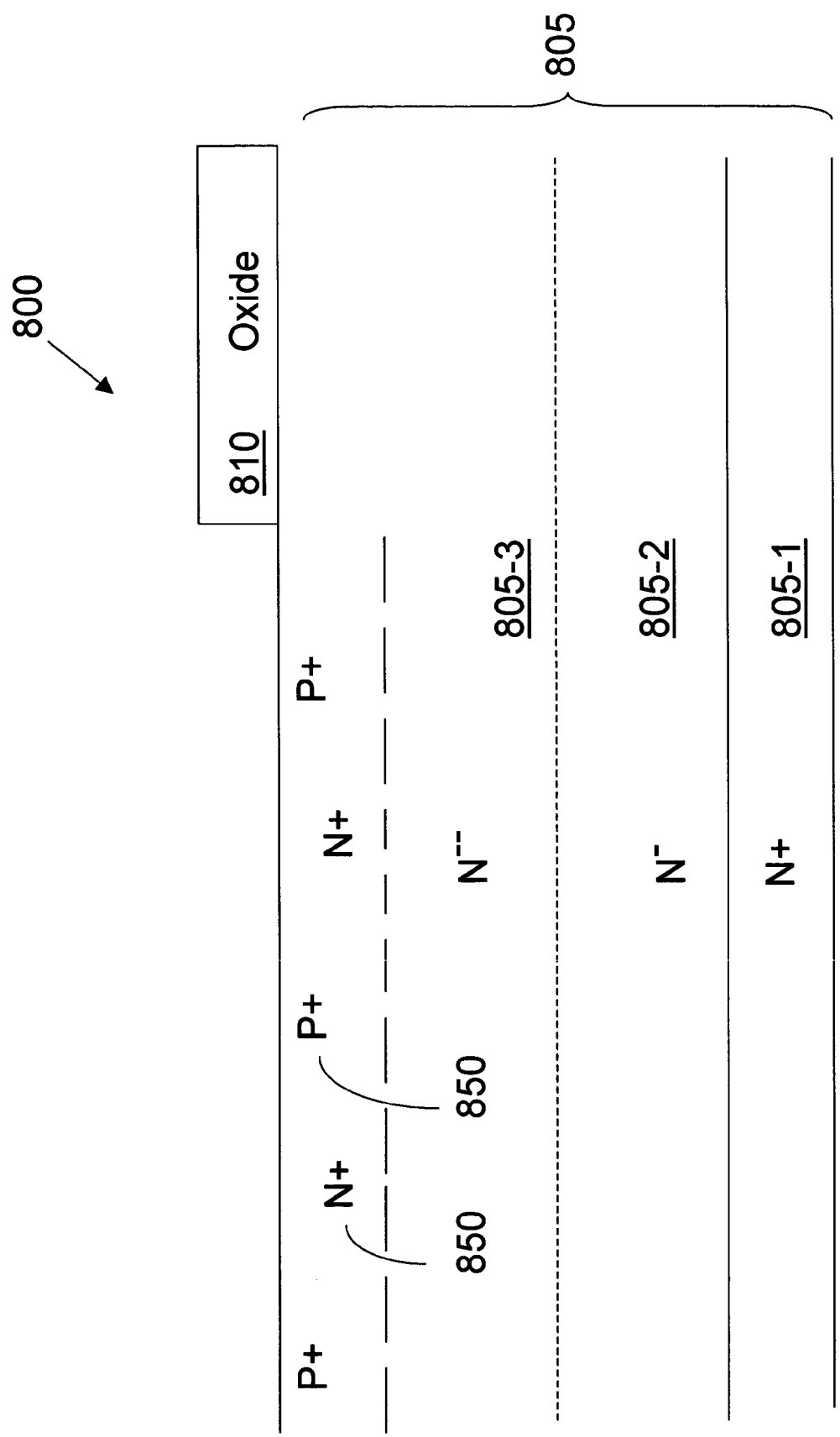
Figure 10G:
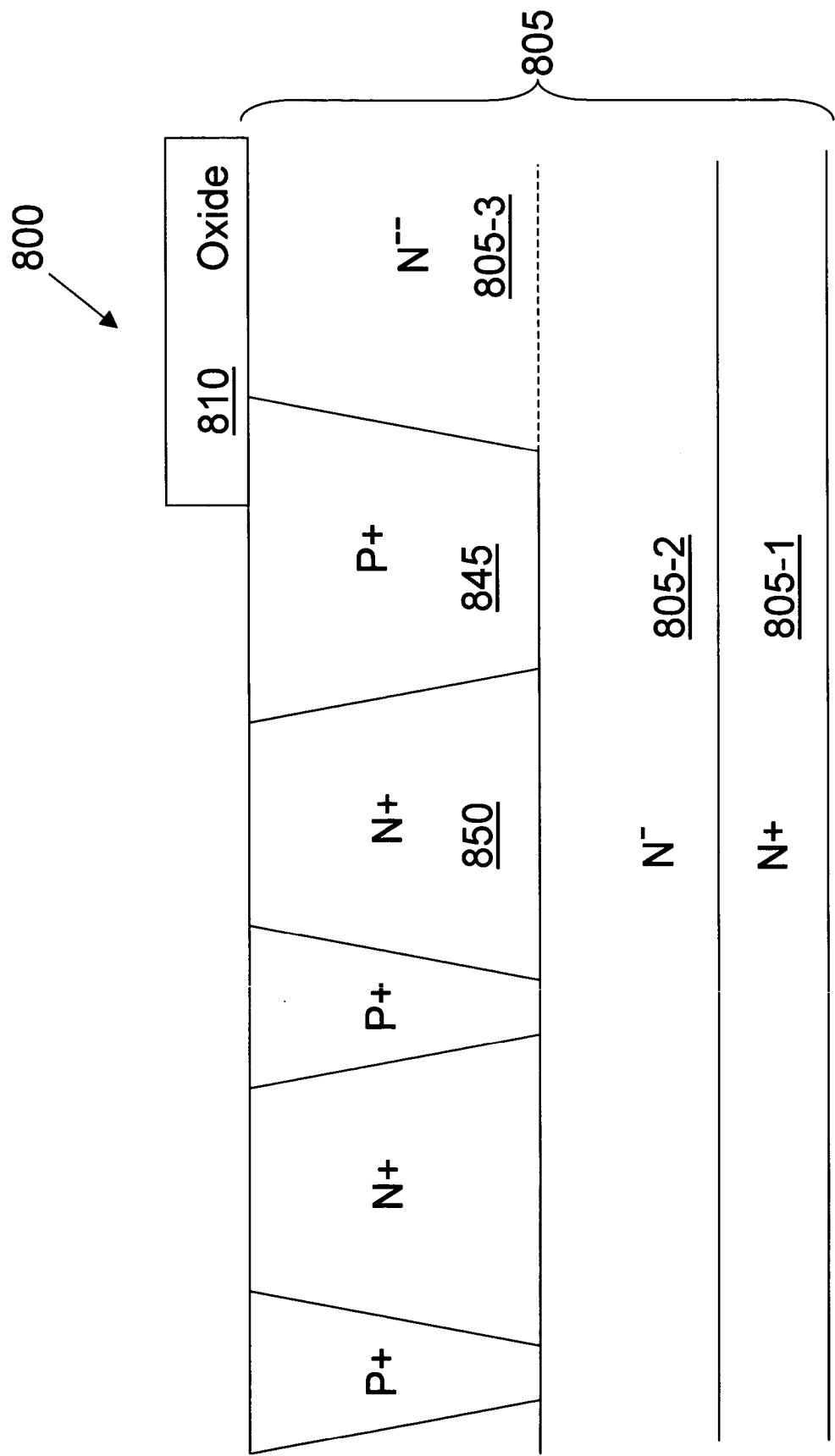
Figure 10H:
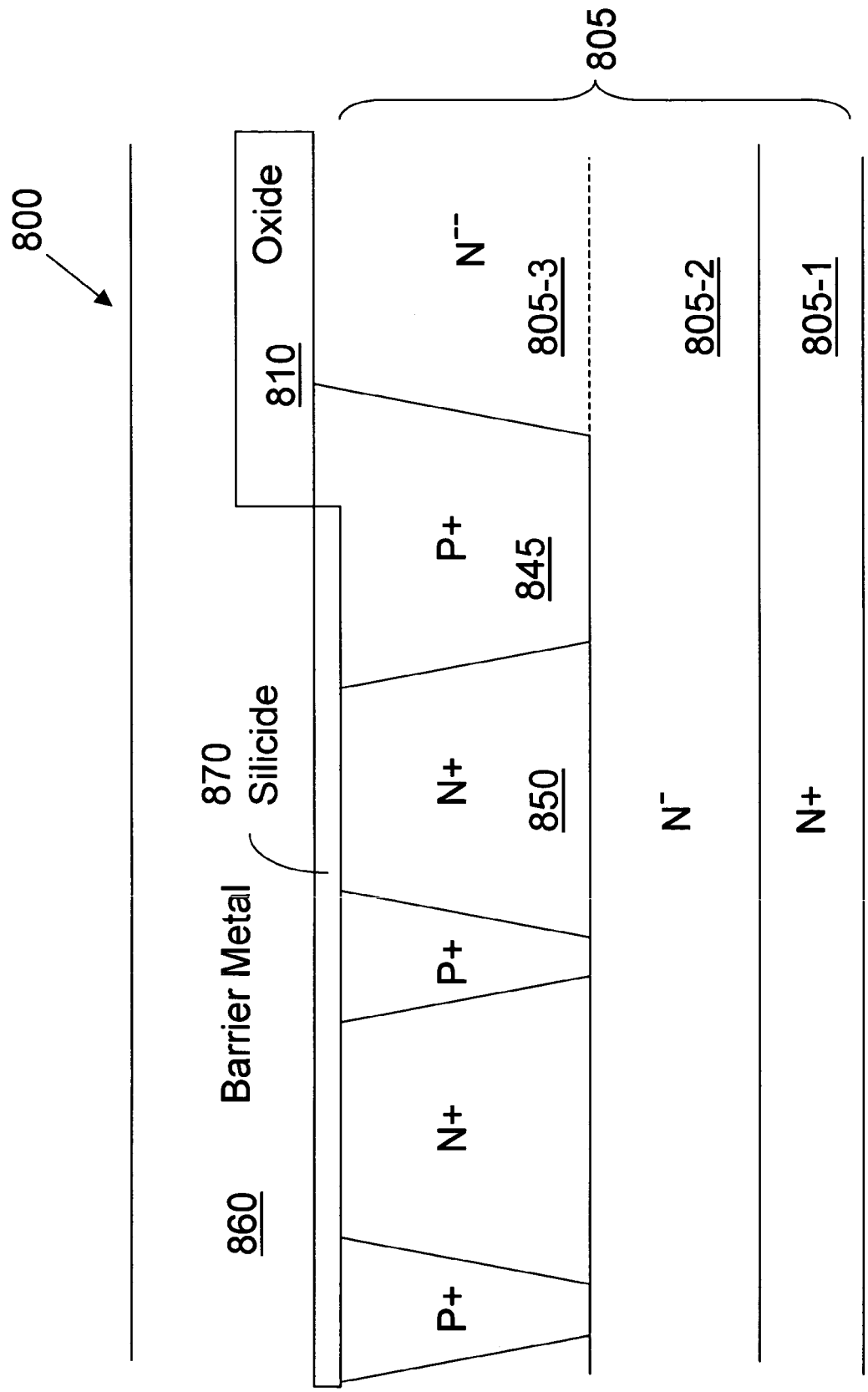
Figure 10I:
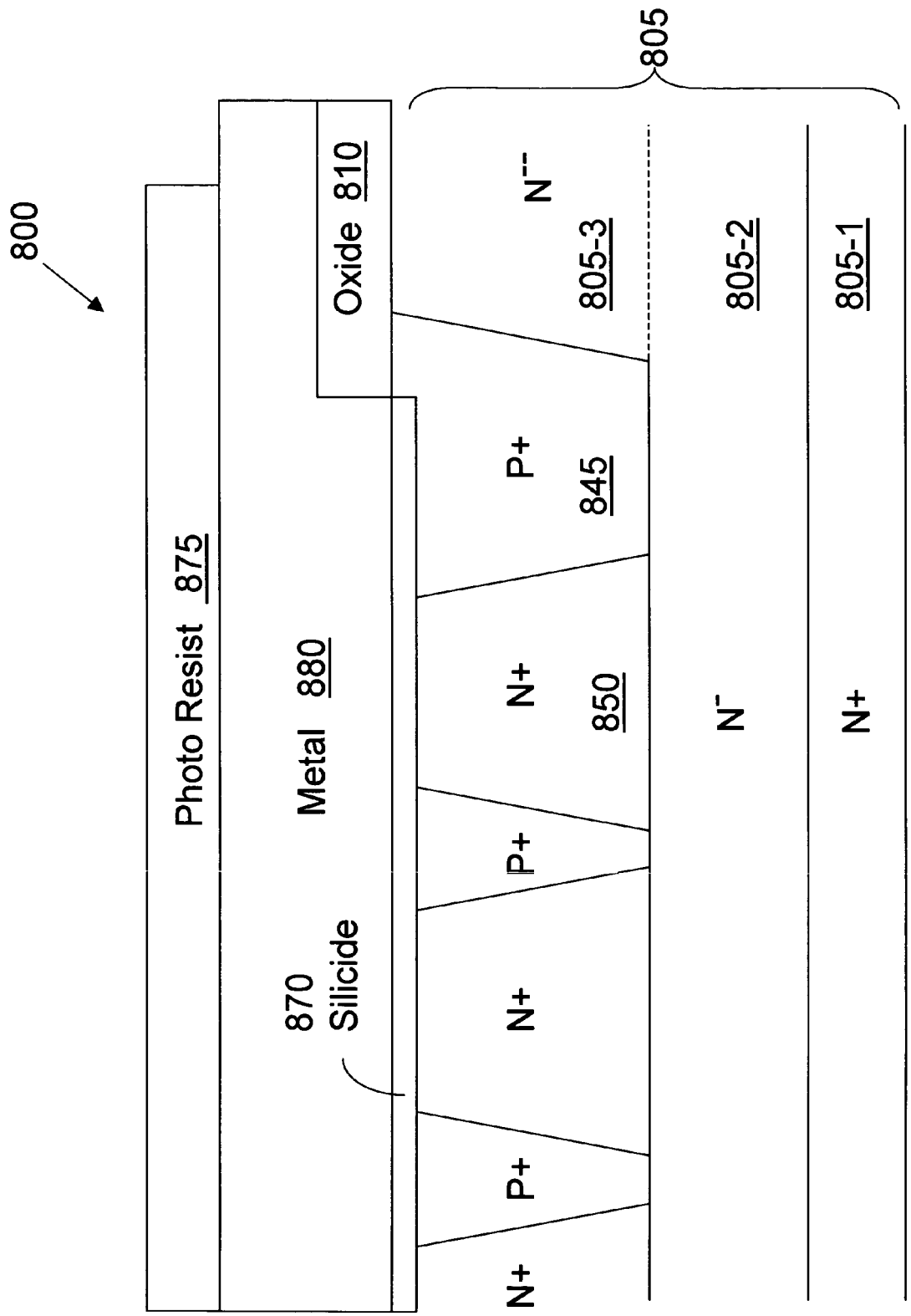
Figure 10J:
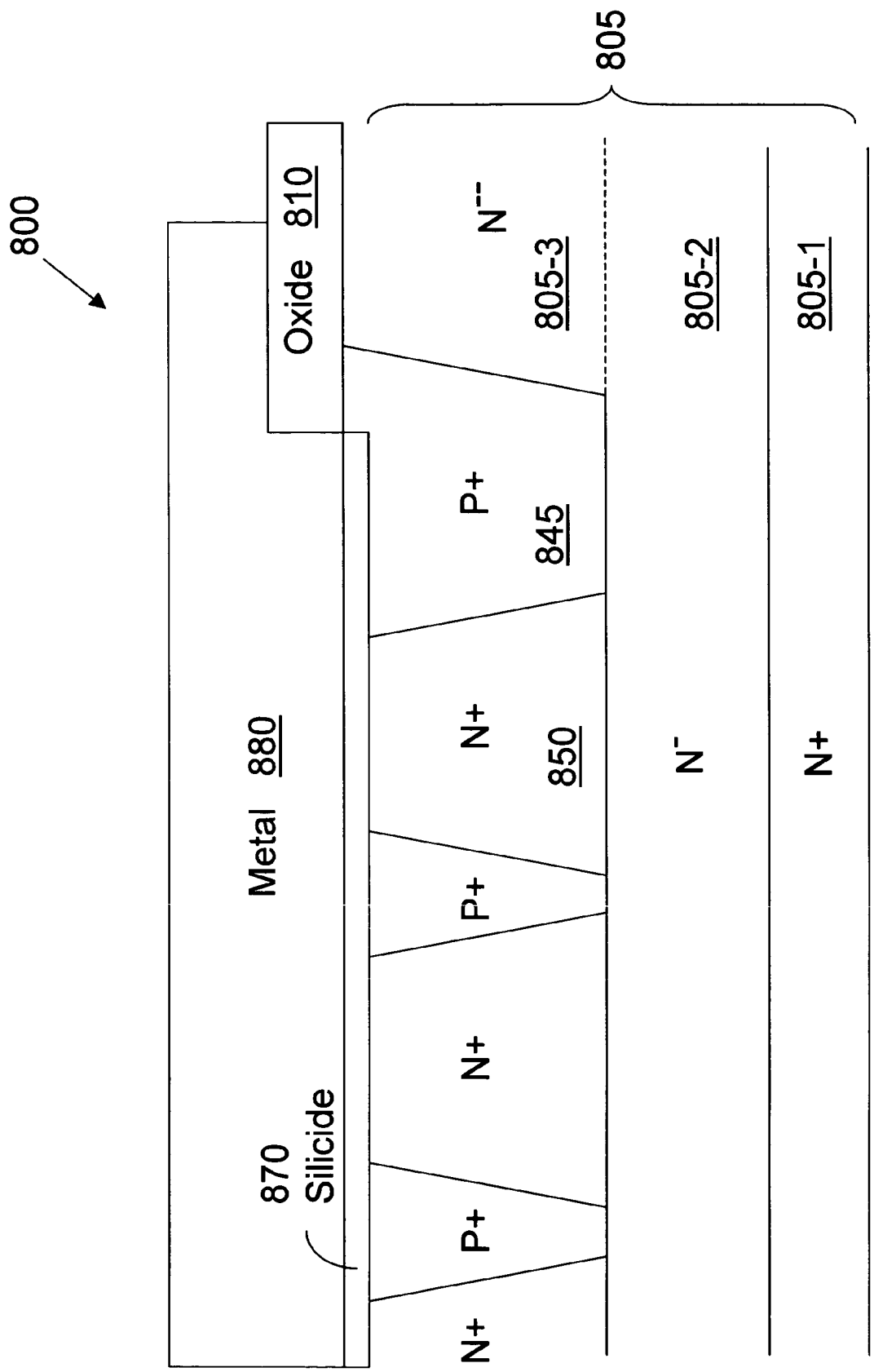

Referring to FIGS. 10A to 10J for a series of cross sectional views to show the processing steps for manufacturing a Schottky junction barrier device as that shown in FIG. 9A. The process begins with an initial step of oxidation by applying a temperature ranging from 900° C.-1150° C. to a substrate 805 to that includes a N+ bottom layer 805-1, a middle layer N− lyer 805-2 and a top N−−layer 805-3. An oxide layer 810 with a layer thickness of 1000 to 10,000 Angstroms is formed on top of the substrate 805. A thermal oxidation is preferred for surface Si/SiO2 interface charge. The oxide layer 810 is necessary for the field oxide plate termination to withstand the operating voltage and also allows for an etchback step to serve as ion implantation mask, which will be further described below. A photoresist 815 is then formed on top of the oxide layer 810 followed by an oxide etch and photoresist removal as shown in FIG. 10B. FIG. 10C shows a pad oxidation layer 820 is formed at a temperature around 850° C. in dry or steam environment with a thickness of about 200-500 A Angstroms for the purpose of minimizing silicon damages during the subsequent ion implantations. In FIG. 10D, the substrate is implanted with P+ ions 825 of boron at an energy of 30-100 Kev and an ion dose ranging from $5 \times 10^{12}$/cm$^2$ to $5 \times 10^{14}$/cm$^2$ thus forming a P+ layer 830. Referring to FIG. 10E, a N+ photoresist 835 is applied followed by a N+ implant with phosphorous-31 ions 840 at an energy of approximately 80 Kev and an ion dose ranging from $8.0 \times 10^{12}$/cm$^2$ to $8.0 \times 10^{14}$/cm$^2$. The P+ layer 830 thus develops a plurality of P+ and N+ regions 845 and 850 followed by the removal of the photoresist 835 as that shown in FIG. 10F. Referring to FIG. 10G where a process of simultaneous drive of the P+ and N+ regions 845 and 850 respectively is performed by applying a temperature around 1050° C.-1150° C. for about 30 minutes to 10 hours to a depth of approximately 0.5 to 10 micrometers. The P+ and N+ diffusion process is carried out in an ambient condition of cycled N2, O2 and HCl for the purpose of reducing the surface stress and surface defects during the elevated temperature condition. A thin oxide layer of about 200-1000 Angstroms is grown and an oxide etch back is performed to remove the oxide layer. In FIG. 10H, a barrier metal layer 860 that includes Titanium (Ti), Ti/TiN, Nichrome(Ni), Plantium(Pt), Molybrium(Mo), or NiPt combination, etc. having a total thickness greater than 0.2 micrometers is formed on top of the surface. A barrier layer sintering process is carried out at a temperature between 400° to 700° C. for 30 to 60 minutes or Rapid thermal Anneal at temperatures between 400° to 800° C. for 10 to 60 seconds in an ambient nitrogen condition. A silicide layer 870 is then formed underneath the barrier layer 860. In FIG. 10I, the remaining unreactive barrier of the barrier layer 860 is removed with Aqua Rega. A thick metal 880 with thickness greater than 10 KA, such as Aluminum (Al), or Al/Si/Cu, or Al/Si, or Al/Cu, or Ti/Ni/Ag is deposited. A photoresist 875 is applied over the thick metal layer 880 then a metal etch process is performed, and the photoresist layer 875 is removed as that shown in FIG. 10J.

In a practical embodiment, the top epitaxial layer 805-3 has a lowest doping concentration typically of phosphorus ions, the bottom epixtaxial layer 805-2 has a higher doping concentration typically of phosphorous ions. The substrate layer 805-1 based on common industry standard has a resistivity of less than five millie-Ohm-cm, and generally doped with Arsenic ions. The thickness and dopant concentration of the top epi-layer 805-3 can be adjusted to allow for the depth of the P+ diffusion that will substantially depending on the implant energy, dose and diffusion temperature and time of the diffusion process. Generally, as the rated voltage increases for a Schottky device, the thickness of the top epi-layer 805-3 will also increase to support a higher voltage. A lower N-dopant concentration in the top epi-layer 805-3 produces a Schottky device having a deeper P+ junction. Reduced N-dopant concentration in the top N--layer 805-3 also favors the N-type diffusion to have a increased diffusion depth. Similar to the effects to the P-type implant, the thickness and dopant concentration of the top N--layer 805-3 may be adjusted together with the implant energy, does, diffusion temperature and time to influce the P+ well and the N+ well to generate favorable forward and reverse current conductions.

Furthermore, the thickness and/or dopant concentration of the bottom epi-layer 805-2 can also be adjusted to influence the depth of the P+ diffusion, to regulate the out-diffusion from the substrate and to shape the P+ well for better forward current conduction. Therefore, the embodiment as described above has three combined thicknesses and concentration attributes that can be adjusted dependent on the photolithographic capabilities, process diffusion profiles, silicide barrier heights, ohmic metallizations on the desired blocking voltages, reverse currents and forward voltages capabilities. Design and manufacture flexibilities are allowed for a rated product of Schottky device as described in this invention to optimize the thickness and doping concentrations for these three layers, i.e., layers 805-1 to 805-3, to achieve optimized functional parameters of Vbr, Vf and reverse recovery performance.

According to above descriptions, this invention discloses a junction-barrier rectifying device supported on a substrate. The device includes a plurality of first diffusion and diffusion regions of different conductivity types formed by a diffusion of ions of a first conductivity and a second conductivity into the substrate. In a preferred embodiment, the substrate further comprising a first semiconductor layer of the first conductivity disposed below the first and second diffusion regions. In a preferred embodiment, the substrate further comprising a second semiconductor layer of the first conductivity disposed below the first and second diffusion regions wherein the second semiconductor layer disposed above and having a lower impurity concentration of the first conductivity than the first semiconductor layer. In a preferred embodiment, the ions of the and second conductivity types each having different vertical and lateral diffusion coefficients. In a preferred embodiment, the ions of the first conductivity are N type ions and the ions of the second conductivity are P type ions in the substrate wherein each of the N-type and P-type ions having different vertical and lateral diffusion coefficients. In a preferred embodiment, the N-type ions having a higher lateral diffusion coefficient than a vertical diffusion coefficient and the P-type ions having higher vertical diffusion coefficient than a lateral diffusion coefficient. In a preferred embodiment, the each of the first and second diffusion regions having a prescribed width disposed as neighboring regions adjacent to each other. In a preferred embodiment, the junction barrier-rectifying device further includes an anode electrode and a cathode electrode for applying a voltage over the substrate. In a preferred embodiment, one of electrodes further includes a conductive layer covering a surface of the substrate for contacting the first and second diffusion regions. In a preferred embodiment, the conductive layer further comprising a silicide layer covering a top surface of the substrate for contacting the first and second diffusion regions. In a preferred embodiment, the conductive layer further comprising an ohmic metal layer covering a top surface of the substrate for contacting the first and second diffusion regions.

This invention further discloses a method for configuring a junction barrier Schottky device on a substrate. The substrate has a first and a second semiconductor layers of a first conductivity wherein the second semiconductor layer disposed above and having a lower impurity concentration than the first semiconductor layer. The method includes a step of doping and diffusing a first diffusion region with a higher impurity concentration of the first conductivity into the second semiconductor layer for functioning as a forward barrier height reduction region. The method further includes another step of doping and diffusing into the second semiconductor layer a second diffusion region of a second conductivity type for functioning as a backward blocking enhancement region. In a preferred embodiment, the steps of doping and diffusing the first and second diffusion regions into the second semiconductor layer further comprising of simultaneous diffusing ions of the first and second conductivities into a plurality of the first diffusion and second diffusion regions into the second semiconductor layer.

In essence, this invention discloses a method for manufacturing a junction barrier rectifying device on a semiconductor substrate. The method includes a step of implanting and diffusing ions of a first and a second conductivity types into the semiconductor substrate to form a plurality of first diffusion and second diffusion regions. In a preferred embodiment, the step of implanting and diffusion the plurality of ions of a first and a second conductivities into the semiconductor substrate further comprising implanting and diffusion the plurality of ions into a second semiconductor layer of a semiconductor substrate having a first and a second semiconductor layers of the first conductivity wherein the second semiconductor layer disposed above and having a lower impurity concentration than the first semiconductor layer. In a preferred embodiment, the step of implanting and diffusing ions of the first and second conductivities further comprising a step of implanting and simultaneous diffusing ions of the first and second conductivities each having different vertical and lateral diffusion coefficients. In a preferred embodiment, the step of implanting and diffusing ions of the first and second conductivities further comprising a step of implanting and simultaneous diffusing ions of the second conductivity as a guard ring in a termination area for sustaining a breakdown voltage.

This invention further discloses a method of fabricating a junction barrier Schottky device on a semiconductor substrate having an active region. The method further includes a step of applying an implanting and diffusion mask in the active region to form a plurality of PN junctions alternately arranged in the substrate. In a preferred embodiment, the step of applying an implanting and diffusion mask further comprises a step of applying a photoresist as the implanting and diffusion mask. In a preferred embodiment, the step of applying an implanting and diffusion mask further comprising a step of applying a patterned oxide layer as the implanting and diffusion mask. In a preferred embodiment, the step of applying an implanting and diffusion mask further comprising a step of applying a patterned nitride layer as the implanting and diffusion mask. In a preferred embodiment, the step of applying an implanting and diffusion mask further comprising a step of applying a patterned nitride layer as the implanting and diffusion mask. In a preferred embodiment, the step of applying an implanting and diffusion mask the PN junction in the layer further comprising a step of forming the PN junction in a single epitaxial layer in the semiconductor substrate. In a preferred embodiment, the step of applying an implanting and diffusion mask the PN junction in the layer further comprising a step of forming the PN junction in a single epitaxial layer with a uniform ion concentration in the semiconductor substrate. In a preferred embodiment, the step of applying an implanting and diffusion mask the PN junction in the layer further comprising a step of forming the PN junction in a single epitaxial layer with a non-uniform ion concentration in the semiconductor substrate. In another preferred embodiment, the single epitaxial layer has a linear or step graded impurity concentration.

This invention further discloses a method of fabricating a junction barrier Schottky device on a semiconductor substrate having an active region. The method further includes a step of applying an implanting and diffusion mask in the active region to form a plurality of PN-PN junctions alternately arranged in the substrate. In a preferred embodiment, the step of applying an implanting and diffusion mask further comprises a step of applying a photoresist as the implanting and diffusion mask. In a preferred embodiment, the step of applying an implanting and diffusion mask further comprising a step of applying a patterned oxide layer as the implanting and diffusion mask. In a preferred embodiment, the step of applying an implanting and diffusion mask further comprising a step of applying a patterned nitride layer as the implanting and diffusion mask. In a preferred embodiment, the step of applying an implanting and diffusion mask further comprising a step of applying a patterned nitride layer as the implanting and diffusion mask. In a preferred embodiment, the step of applying an implanting and diffusion mask the PN-PN junction in the layer further comprising a step of forming the PN-PN junction in a single epitaxial layer in the semiconductor substrate. In another preferred embodiment, the single epitaxial layer has a linear or step graded impurity concentration.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

We claim:

1. A junction barrier Schottky device comprising:
 a first semiconductor layer of a first conductivity type and a second semiconductor layer disposed above and having a lower impurity concentration of said first conductivity type than said first semiconductor layer;
 a first diffusion region of said first conductivity type having a higher impurities concentration than said impurity concentration of the second semiconductor layer, for functioning as a forward barrier height reduction region;
 a second diffusion region of a second conductivity type disposed adjacent to said first diffusion region for functioning as a backward blocking enhancement region and said first and second diffusion regions disposed above said second semiconductor layer; and
 a terminal semiconductor region of said first conductivity disposed above said second semiconductor layer, and having a lower impurity concentration than said second semiconductor layer wherein said terminal semiconductor region disposed near a terminal edge in said junction barrier Schottky device.

2. The junction barrier Schottky device of claim 1 further comprising:
 a plurality of said first diffusion and second diffusion regions disposed alternately adjacent to each other.

3. The junction barrier Schottky device of claim 1 further comprising:
 a plurality of said first diffusion and second diffusion regions disposed alternately adjacent to each other having a prescribed width as a prescribed interval between every two of said first and second diffusion regions.

4. The junction barrier Schottky device of claim 1 further comprising:
 a plurality of said first diffusion and second diffusion regions formed by a simultaneous diffusion of ions of said first and second conductivity into said second semiconductor layer.

5. The junction barrier Schottky device of claim 1 further comprising:
 a plurality of said first diffusion and second diffusion regions formed by a simultaneous diffusion of ions of said first and second conductivity into said second semiconductor layer wherein said ions of said first and second conductivity types each having different vertical and lateral diffusion coefficients.

6. The junction barrier Schottky device of claim 1 further comprising:
 a plurality of said first diffusion and second diffusion regions formed by a simultaneous diffusion of ions of said first conductivity type of N type ions and said second conductivity type of P type ions into said second semiconductor layer wherein each of said N-type and P-type ions having different vertical arid lateral diffusion coefficients.

7. The junction barrier Schottky device of claim 1 further comprising:
 a plurality of said first diffusion and second diffusion regions formed by a simultaneous diffusion of ions of said first conductivity type of N-type ions and said second conductivity type of P-type ions into said second semiconductor layer wherein said N-type ions having a higher lateral diffusion coefficient than a vertical diffusion coefficient and said P-type ions having higher vertical diffusion coefficient than a lateral diffusion coefficient.

8. The junction barrier Schottky device of claim 1 further comprising:
 a plurality of said first diffusion and second diffusion regions disposed formed by a simultaneous diffusion of ions of said first and second conductivity into said second semiconductor layer with each of said first and second diffusion regions having a prescribed width disposed as neighboring regions adjacent to each other.

9. The junction barrier Schottky device of claim 1 further comprising:
 an anode and a cathode electrodes for applying a voltage over said substrate.

10. The junction barrier Schottky device of claim 9 wherein:
 one of said electrodes further comprising a conductive layer covering a top surface of said substrate for contacting said first and second diffusion regions.

11. The junction barrier Schottky device of claim 10 wherein:

said conductive layer further comprising a silicide layer covering a top surface of said substrate for contacting said first and second diffusion regions.

12. The junction barrier Schottky device of claim 10 wherein:
said conductive layer further comprising a metal layer covering a top surface of said substrate for contacting said first and second diffusion regions.

13. The junction barrier Schottky device of claim 2 wherein:
at least one of second diffusion regions disposed in a termination area serving as a guard ring for breakdown voltage sustaining.

14. The junction barrier Schottky device of claim 10 wherein:
another electrode is formed on a bottom surface opposite said top surface contacting said first semiconductor layer.

* * * * *